United States Patent
Taoka et al.

(10) Patent No.: US 6,760,892 B2
(45) Date of Patent: Jul. 6, 2004

(54) APPARATUS FOR EVALUATING LITHOGRAPHY PROCESS MARGIN SIMULATING LAYOUT PATTERN OF SEMICONDUCTOR DEVICE

(75) Inventors: Hironobu Taoka, Hyogo (JP); Akihiro Nakae, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 42 days.

(21) Appl. No.: 10/183,394

(22) Filed: Jun. 28, 2002

(65) Prior Publication Data

US 2003/0154460 A1 Aug. 14, 2003

(30) Foreign Application Priority Data

Jan. 8, 2002 (JP) ........................................ 2002-001626

(51) Int. Cl.[7] .............................................. G06F 17/50
(52) U.S. Cl. ................. 716/4; 716/19; 716/21
(58) Field of Search .............................. 716/4, 5, 11, 1, 716/3, 8, 19, 20, 21, 10, 2, 18; 730/5, 30, 312, 311

(56) References Cited

U.S. PATENT DOCUMENTS

| | | | | |
|---|---|---|---|---|
| 4,835,704 A | * | 5/1989 | Eichelberger et al. | 716/21 |
| 5,740,068 A | * | 4/1998 | Liebmann et al. | 716/21 |
| 6,289,499 B1 | * | 9/2001 | Rieger et al. | 716/21 |
| 6,584,609 B1 | * | 6/2003 | Pierrat et al. | 716/19 |
| 2002/0188925 A1 | * | 12/2002 | Higashi | 716/21 |
| 2003/0126581 A1 | * | 7/2003 | Pang et al. | 716/19 |

* cited by examiner

Primary Examiner—Vuthe Siek
Assistant Examiner—Binh C. Tat
(74) Attorney, Agent, or Firm—McDermott, Will & Emery

(57) ABSTRACT

A layout pattern generating unit within a lithography process margin evaluating apparatus generates a plurality of design layout patterns, using an analysis condition and information stored in a layout pattern template holding unit. In addition, a simulation condition generating unit generates a plurality of simulation conditions, using the analysis condition and information stored in a simulation condition template holding unit. A simulation unit generates a plurality of actual layout patterns, using a generated condition. Thus, the lithography process margin evaluating apparatus can reduce operational burden and improve accuracy.

6 Claims, 26 Drawing Sheets

FIG.5

SELECTION LAYOUT PATTERN TEMPLATE NO. ⎯ 201

SELECTION SIMULATION CONDITION TEMPLATE NO. ⎯ 202

| LAYOUT PATTERN ANALYSIS CONDITION ⎯ 203 ||||||||
|---|---|---|---|---|---|---|---|
| W ($\mu$m) ||| L ($\mu$m) ||| S ($\mu$m) |||
| INITIAL VALUE | PITCH | FINAL VALUE | INITIAL VALUE | PITCH | FINAL VALUE | INITIAL VALUE | PITCH | FINAL VALUE |
|  |  |  |  |  |  |  |  |  |

| SIMULATION ANALYSIS CONDITION ⎯ 204 ||||
|---|---|---|---|
| DEFOCUS VALUE X ($\mu$m) ||| DOF SETTING | OBJECT TO BE ANALYZED |
| INITIAL VALUE | PITCH | FINAL VALUE |  |  |
|  |  |  |  |  |

FIG.17

SELECTION LAYOUT PATTERN TEMPLATE NO. ⌐ 201

SELECTION SIMULATION CONDITION TEMPLATE NO. ⌐ 202

| LAYOUT PATTERN ANALYSIS CONDITION | | | | | | | | |
|---|---|---|---|---|---|---|---|---|
| W (μm) | | | L (μm) | | | S (μm) | | |
| INITIAL VALUE | PITCH | FINAL VALUE | INITIAL VALUE | PITCH | FINAL VALUE | INITIAL VALUE | PITCH | FINAL VALUE |
|  |  |  |  |  |  |  |  |  |

| SIMULATION ANALYSIS CONDITION | | | | |
|---|---|---|---|---|
| DEFOCUS VALUE X (μm) | | | DOF SETTING | OBJECT TO BE ANALYZED |
| INITIAL VALUE | PITCH | FINAL VALUE | | |
|  |  |  |  |  |

REFERENCE CD VALUE ⌐ 205

FIG.25

SELECTION LAYOUT PATTERN TEMPLATE NO. ☐ 201

SELECTION SIMULATION CONDITION TEMPLATE NO. ☐ 202

LAYOUT PATTERN ANALYSIS CONDITION

| W (μm) | | | L (μm) | | | S (μm) | | |
|---|---|---|---|---|---|---|---|---|
| INITIAL VALUE | PITCH | FINAL VALUE | INITIAL VALUE | PITCH | FINAL VALUE | INITIAL VALUE | PITCH | FINAL VALUE |
|  |  |  |  |  |  |  |  |  |

Lopc (μm)

| INITIAL VALUE | PITCH | FINAL VALUE |
|---|---|---|
|  |  |  |

SIMULATION ANALYSIS CONDITION

| DEFOCUS VALUE X (μm) | | | DOF SETTING | OBJECT TO BE ANALYZED |
|---|---|---|---|---|
| INITIAL VALUE | PITCH | FINAL VALUE | | |
|  |  |  |  |  |

APPARATUS FOR EVALUATING LITHOGRAPHY PROCESS MARGIN SIMULATING LAYOUT PATTERN OF SEMICONDUCTOR DEVICE

BACKGROUND OF THE INVENTION

1. Field of the Invention

The present invention relates to a lithography process margin evaluating apparatus, and more specifically to a lithography process margin evaluating apparatus simulating a layout pattern of a semiconductor device in manufacturing a semiconductor.

2. Description of the Background Art

Lithography process is one of techniques to transfer a layout pattern of a semiconductor device to a semiconductor substrate. In a lithography process, a photosensitive resin (hereinafter, referred to as a photoresist) is first applied to the semiconductor substrate. Using an exposure apparatus, a layout pattern (hereinafter, referred to as a design layout pattern) on a mask is then exposed onto the photoresist on the semiconductor substrate. When the exposed photoresist is developed, the layout pattern of the transferred resin (hereinafter, referred to as an actual layout pattern) is formed. Through etching or ion implantation using the resin pattern, an actual layout pattern is formed on the semiconductor substrate.

In the lithography process, a transfer margin to the semiconductor substrate considerably varies, depending on optical conditions and shapes of design layout patterns. Accordingly, an actual layout pattern relative to a design layout pattern has conventionally been predicted with simulations.

FIG. 27 is a block diagram showing a configuration of a conventional lithography simulation apparatus.

Referring to FIG. 27, a lithography simulation apparatus 10 includes a hard disk 11, a simulation unit 15 and an input unit 16. Hard disk 11 includes a layout holding unit 12, a simulation condition holding unit 13 and a simulation result holding unit 14.

Layout holding unit 12 holds information of a design layout pattern input through input unit 16. Simulation condition holding unit holds a simulation condition entered through input unit 16. Examples of simulation conditions are exposure wavelength, Numerical Aperture (hereinafter, referred to as "NA") and the like. Simulation result holding unit 14 holds a result from simulation performed at simulation unit 15.

Simulation unit 15 simulates an actual layout pattern, using information of the design layout pattern held in layout holding unit 12 and the simulation condition held in simulation condition holding unit 13. Information of the simulated actual layout pattern is held in simulation result holding unit 14.

FIG. 28 is a flow chart showing an operation of the conventional lithography simulation apparatus.

Referring to FIG. 28, a user of lithography simulation apparatus 10 first enters information of the design layout pattern to lithography simulation apparatus 10, using input unit 16 (step S1). Information of the entered design layout pattern is stored in layout holding unit 12. The user then enters the simulation condition, using input unit 16 (step S2). The entered simulation condition is stored in simulation condition holding unit 13. Simulation unit 15 within lithography simulation apparatus 10 simulates the actual layout pattern, using information of the design layout pattern and the simulation condition (step S3). The simulated actual layout pattern is stored in simulation result holding unit 14 (step S4). The user measures light intensity distribution within a photosensitive material and a shape of the actual layout pattern, using the simulation result stored in simulation result holding unit 14 (step S5). Thereafter, the user analyzes, for example, a difference in shape from the design layout pattern (step S6).

As described above, a conventional lithography process margin apparatus has performed a simulation of an actual layout pattern relative to a single design layout pattern.

In present days, since a design rule for a semiconductor device has been made smaller than a light source wavelength of an exposure apparatus, resolution of a layout pattern of the semiconductor device after transfer is lowered. In order to improve resolution, a special transfer technique called "resolution enhancement technique" is utilized.

In addition, in the actual layout pattern based on the design layout pattern, a distortion is caused through a manufacturing process. In order to correct the distortion caused therein, optical proximity correction (hereinafter, referred to as OPC) is widely used. Here, OPC is considered to correct process-originated distortions in general. Recently, OPC has become more complex because of smaller size of a semiconductor device. In addition to simply biasing a size of a design layout pattern as in a conventional example, some OPC creates a dummy pattern outside the design layout pattern. Accordingly, in order to determine a specification for OPC, an evaluation should be made for multiple design layout patterns.

As described above, as a semiconductor device is made smaller, a manufacturing process thereof has been changed. As a result, also in simulating a lithography process as well, a need has grown for analysis of a single design layout pattern as well as for margin evaluation of a lithography process with respect to a plurality of design layout patterns.

In a conventional lithography simulation apparatus, however, only a simulation of an actual layout pattern relative to a single design layout pattern was possible. Consequently, in order to perform lithography process margin evaluation for a plurality of design layout patterns, a user had to input a plurality of design layout patterns, enter a plurality of simulation conditions, and measure a plurality of actual layout patterns. Thus, operational burden to the user was significant.

SUMMARY OF THE INVENTION

An object of the present invention is to provide a lithography process margin evaluating apparatus with high accuracy, capable of reducing operational burden.

A lithography process margin evaluating apparatus according to the present invention simulates, from a design layout pattern formed on a mask, a light intensity distribution within a photosensitive material on a semiconductor substrate and an actual layout pattern formed on the semiconductor substrate, and includes an analysis condition input unit, a layout pattern template holding unit, a simulation condition template unit, a measuring condition holding unit, a layout pattern generating unit, a simulation condition generating unit, a simulation unit, a measuring condition determining unit, and a measuring unit. The analysis condition input unit is for entering an analysis condition for analyzing the actual layout pattern. The layout pattern template holding unit stores a plurality of design layout pattern templates. The simulation condition template holding unit stores a plurality of simulation condition templates. The measuring condition holding unit stores a plurality of measuring conditions for measuring the actual layout pattern. The layout pattern generating unit selects a design layout pattern template, and generates a plurality of design layout patterns based on the analysis condition and the selected design layout pattern template. The simulation condition generating unit selects a simulation condition template, and generates a plurality of simulation conditions based on the entered analysis condition and the selected simulation condition template. The simulation unit simulates the actual layout pattern transferred to the photosensitive material on the semiconductor substrate, using the plurality of design layout patterns and the plurality of simulation conditions. The measuring condition determining unit determines a measuring condition among a plurality of measuring conditions based on the analysis condition. The measuring unit measures the actual layout pattern with the determined measuring condition.

Thus, the lithography process margin evaluating apparatus can generate a plurality of design layout patterns in accordance with the analysis condition, and simulate a plurality of actual layout patterns corresponding to the plurality of design layout patterns. In addition, the lithography process margin evaluating apparatus can measure each of the plurality of actual layout patterns. Consequently, operational burden will be reduced.

The lithography process margin evaluating apparatus according to the present invention can generate a plurality of design layout patterns, and simulate the same. Thus, operational burden of a user can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a schematic diagram of an analysis condition input image displayed in step S1 in FIG. 4.

FIG. 17 is a schematic diagram of an analysis condition input image displayed in step S1 in FIG. 16.

FIG. 25 is a schematic diagram of an analysis condition input image displayed in step S1 in FIG. 23.

DESCRIPTION OF THE PREFERRED EMBODIMENTS

Figure 1:
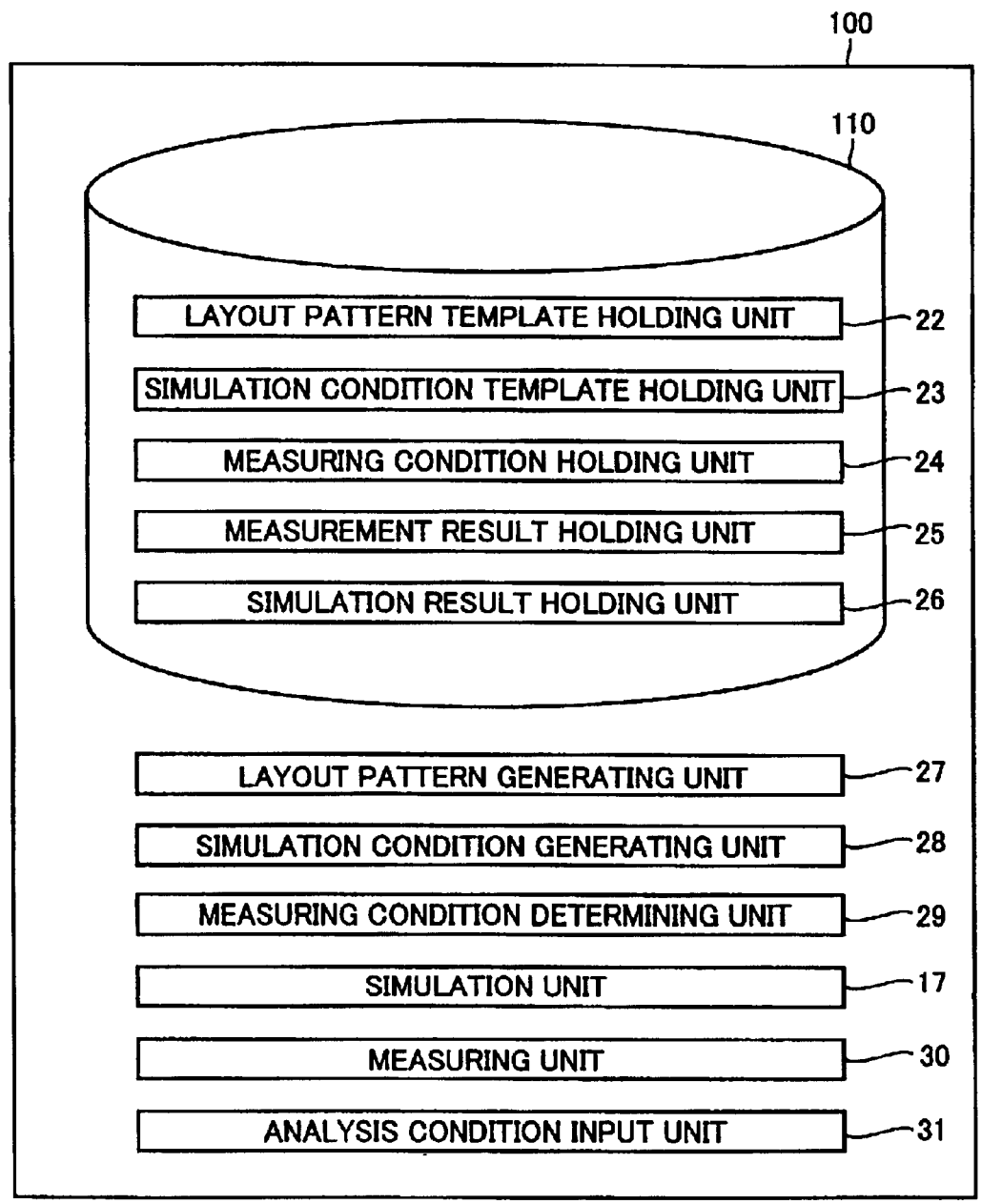
FIG. 1 is a block diagram showing a configuration of a lithography process margin evaluating apparatus in Embodiment 1 of the present invention.

In the following, embodiments of the present invention will be described in detail with reference to the figures. It is noted that the same reference characters refer to the same or corresponding components in the figures, and description thereof is not repeated.

Embodiment 1

FIG. 1 is a block diagram showing a configuration of a lithography process margin evaluating apparatus in Embodiment 1 of the present invention.

Referring to FIG. 1, a lithography process margin evaluating apparatus 100 includes a master file 110, a layout pattern generating unit 27, a simulation condition generating unit 28, a measuring condition determining unit 29, a simulation unit 17, a measuring unit 30 and an analysis condition input unit 31.

Master file 110 includes a layout pattern template holding unit 22, a simulation condition template holding unit 23, a measuring condition holding unit 24, a measurement result holding unit 25 and a simulation result holding unit 26.

Layout pattern template holding unit 22 holds a plurality of design layout pattern templates. Each of the plurality of design layout pattern templates has an identification number.

FIG. 2 is a schematic diagram showing an example of the design layout pattern template held in the layout pattern template holding unit in FIG. 1.

Figure 2A:
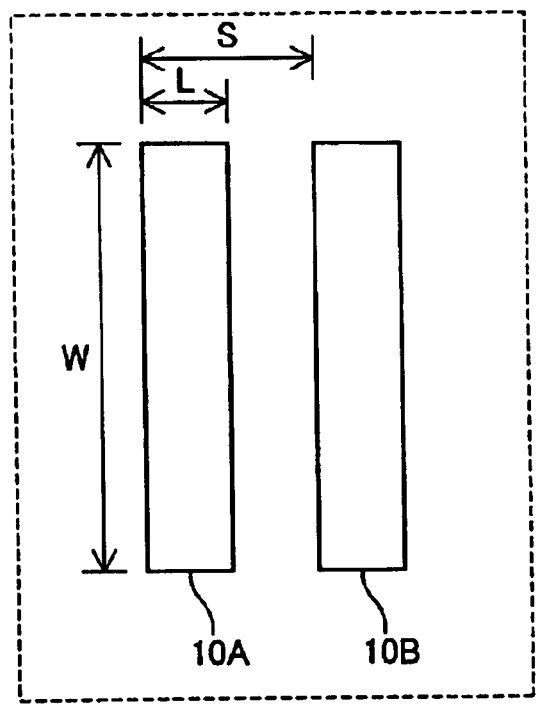
FIG. 2A is a schematic diagram showing an example of a design layout pattern template held in a layout pattern template holding unit in FIG. 1.

Referring to FIG. 2A, the design layout pattern template is composed of a pattern 10A and a pattern 10B having identical shapes. Pattern 10A and pattern 10B are rectangles having width L and length W, and line-and-space thereof has pitch S.

Figure 2B:
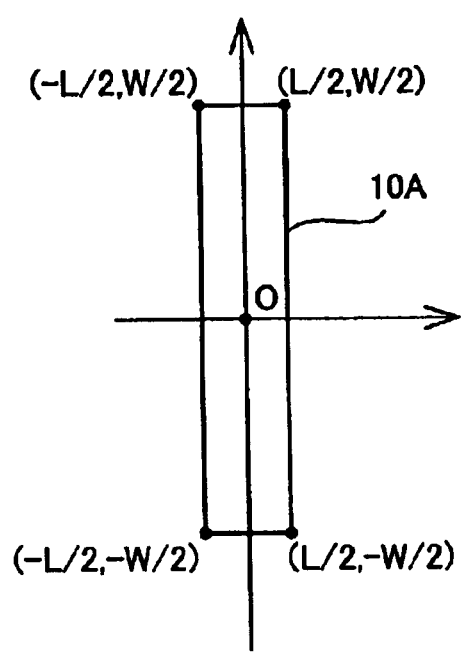
FIG. 2B shows in the form of a graph the pattern in FIG. 2A.

FIG. 2B shows in a graph pattern 10A in FIG. 2A.

Referring to FIG. 2B, pattern 10A is shown in a two-dimensional coordinate system having a center of pattern 10A as an origin. Specifically, pattern 10A is formed with coordinates of vertices of the rectangle, that is, (L/2, W/2), (L/2, -W/2), (-L/2, -W/2) and (-L/2, W/2).

Referring again to FIG. 1, simulation condition template holding unit 23 holds a plurality of simulation condition templates in a simulation condition table. The simulation condition table includes a simulation optical condition table recording an optical condition in simulation, and a simulation etching condition table recording an etching condition in simulation. The simulation optical condition table and the simulation etching table are shown respectively in Tables 1 and 2.

TABLE 1

| Simulation Optical Condition | Optical Condition | | | |
|---|---|---|---|---|
| | Exposure Wavelength | NA | σ | Defocus Value |
| B001 | 248 nm | 7.0 | 0.8 | X μm |
| B002 | • | • | • | • |
| B003 | • | • | • | • |
| • | • | • | • | • |
| • | • | • | • | • |

Referring to Table 1, in the simulation optical condition table, exposure wavelength, numerical apertures NA, degree of coherence σ and defocus value are provided as optical conditions, and each optical condition will be recorded as a fixed value or a variable value for each simulation optical condition.

TABLE 2

| Simulation Etching Condition | Content of Condition |
|---|---|
| C001 | Light Intensity I |
| C002 | Process Model A1 |
| C003 | Process Model A2 |
| • | • |
| • | • |

Referring to Table 2, the simulation etching condition table has a light intensity I or a process model as an etching condition. Each etching condition is recorded as a fixed value or a variable value for each simulation etching condition.

Measuring condition holding unit 24 stores a plurality of measuring conditions for an actual layout pattern after simulation in a measuring condition table shown in Table 3.

TABLE 3

| Measuring Condition | Content of Measurement | Measurement Position | |
|---|---|---|---|
| D001 | CD When Light Intensity I = 0.3 | (-L, 0) | (L, 0) |
| D002 | CD When Light Intensity I = 0.3 | (-L, 1) | (L, 1) |
| D003 | Light Intensity Distribution | (-L, 0) | (L, 0) |
| • | • | • | • |
| D005 | Pattern Width When Light Intensity I = 0.3 | (-S/2, 0) | (S/2, 0) |
| DTEST | Light Intensity | (S/2, 0) | null |

Referring to Table 3, a measurement content and a measurement position is recorded for each measuring condition. Each measuring condition has a measuring condition "No.".

Simulation result holding unit 26 holds information of the actual layout pattern simulated by simulation unit 17.

Measurement result holding unit 25 stores a result from measurement using information of the actual layout pattern stored in simulation result holding unit 26 after simulation.

Analysis condition input unit 31 is provided for entering an analysis condition when a user makes an analysis with lithography process margin evaluating apparatus 100.

Layout pattern generating unit 27 generates a plurality of design layout patterns, using a design layout pattern template stored in layout pattern template holding unit 22 and the analysis condition entered through analysis condition input unit 31.

Simulation condition generating unit 28 generates a plurality of simulation conditions, using a plurality of simulation conditions stored in simulation condition template holding unit 23 and the analysis condition.

Measuring condition determining unit 29 selects a measuring condition suited for the analysis condition from a plurality of measuring conditions stored in the measuring condition holding unit.

Simulation unit 17 performs simulation using a plurality of design layout patterns and a plurality of simulation conditions, and generates a plurality of actual layout patterns.

Measuring unit 30 carries out a measurement, using the measuring condition determined by measuring condition determining unit 29 and based on information of the actual layout pattern.

Figure 3:
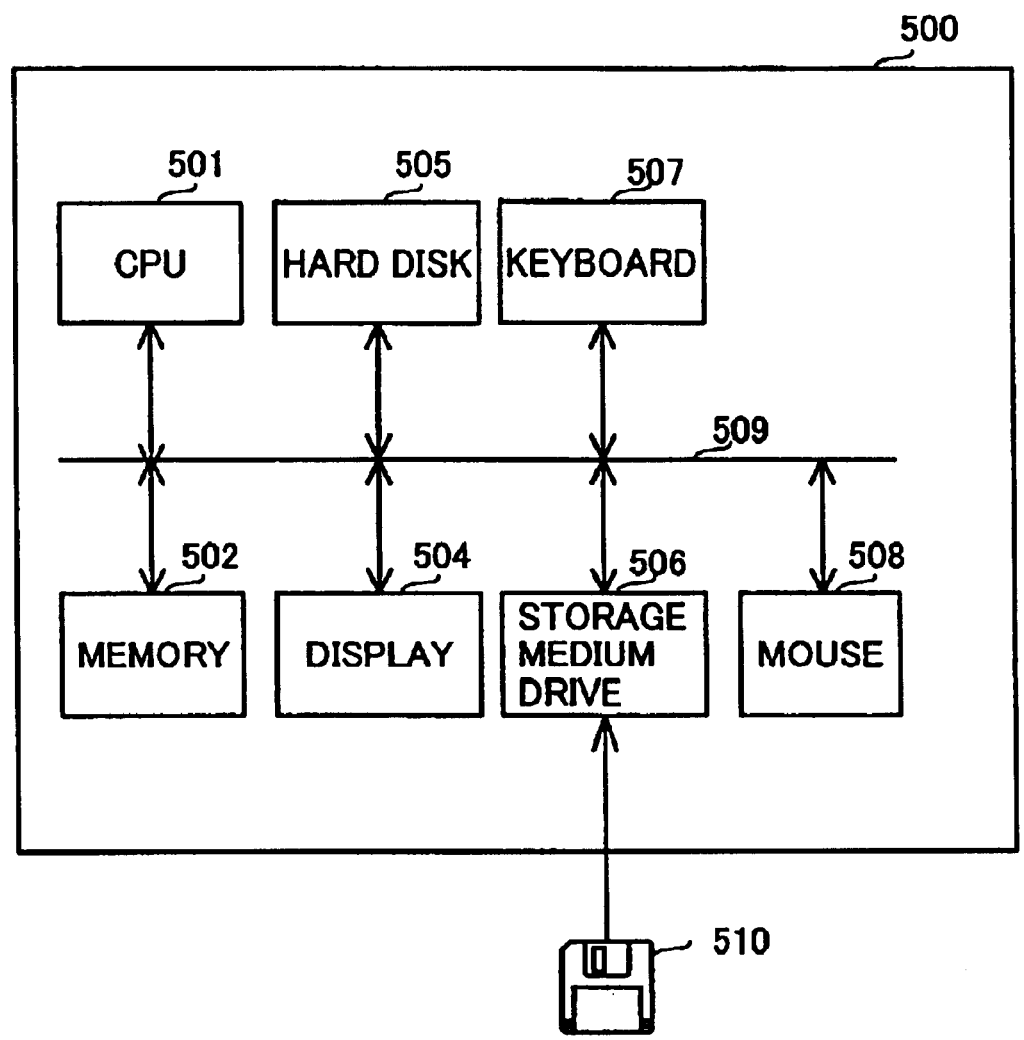
FIG. 3 is a schematic block diagram showing a configuration of a computer.

FIG. 3 is a schematic block diagram showing a configuration of a computer.

An example of a computer is a personal computer. Referring to FIG. 3, a computer 500 includes a CPU 501, a memory 502, a display 504, a hard disk 505, a storage medium drive 506, a keyboard 507 and a mouse 508.

Memory 502 and hard disk 505 function as a memory, keyboard 507 and mouse 508 function as an input device, and display 504 functions as an output device. These are connected to one another by a bus 509.

A storage medium 510 is a computer-readable storage medium, and has a lithography process margin evaluating program stored in advance. When storage medium 510 is attached to storage medium drive 506 and the lithography process margin evaluating program is installed in hard disk 505, computer 500 functions as lithography process margin evaluating apparatus 100.

Here, master file 110 in FIG. 1 corresponds to memory 502 and hard disk 505 in FIG. 3, and layout pattern generating unit 27, simulation condition generating unit 28, measuring condition determining unit 29, simulation unit 17 and measuring unit 30 in FIG. 1 correspond to CPU 501 in FIG. 3. In addition, analysis condition input unit 31 in FIG. 1 corresponds to keyboard 507 and mouse 508 in FIG. 3. Here, storage medium 510 refers to such storage media as a CD-ROM, a magneto-optical (MO) disk or a floppy disk. Usually, an operating system (OS) for enabling an operation of the lithography process margin program is pre-installed in hard disk 505.

An operation of lithography process margin evaluating apparatus 100 having the above-mentioned circuitry will now be described.

An example is described, in which a user analyzes width CD of an actual layout pattern relative to width L of a design layout pattern, using a design layout pattern template shown in FIG. 2A.

Figure 4:
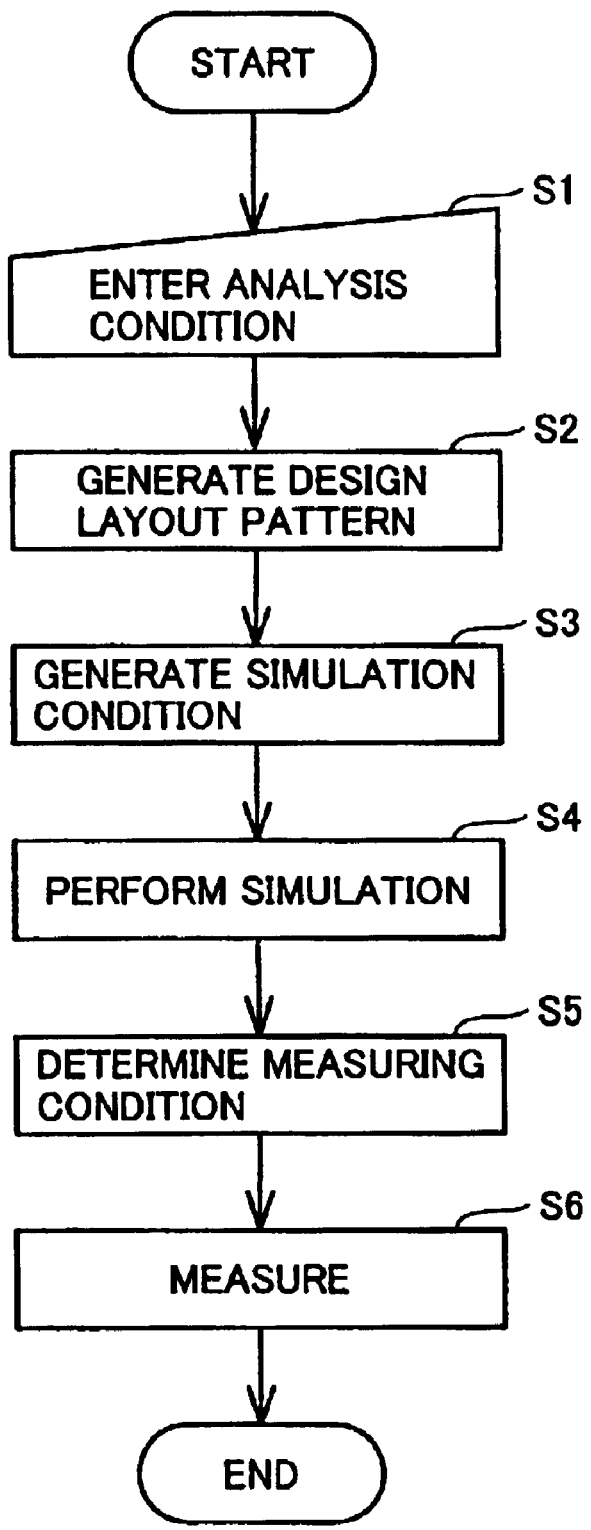
FIG. 4 is a flow chart showing an operation of the lithography process margin evaluating apparatus in Embodiment 1 of the present invention.

FIG. 4 is a flow chart showing an operation of the lithography process margin evaluating apparatus in Embodiment 1 of the present invention.

Referring to FIG. 4, a user initially enters an analysis condition, using analysis condition input unit 31 (step S1). When entering the analysis condition, an analysis condition input image is displayed on display 504 in FIG. 3.

FIG. 5 is a schematic diagram of the analysis condition input image displayed in step S1 in FIG. 4.

Referring to FIG. 5, an analysis condition input image 200 includes a selection layout pattern template No. input section 201, a selection simulation condition template No. input section 202, a layout pattern analysis condition input section 203 and a simulation analysis condition input section 204.

The user enters into selection layout pattern template NO input section 201 an identification number of a design layout pattern template to be used for the present analysis. When the identification number of the design layout pattern template shown in FIG. 2A is "A001", the user enters "A001" in selection layout pattern template NO input section 201. Then the user enters an identification number of a simulation template to be used for the present analysis from a plurality of simulation condition templates held in simulation condition template holding unit 23. For example, the user enters into selection simulation condition template NO input section 202 "B001" from the simulation optical condition table in Table 1 and "C001" from the simulation etching condition table in Table 2.

The user then enters an analysis condition for the design layout pattern template into layout pattern analysis condition input section 203. Here, the user is assumed to fix length W to be 1.0 $\mu$m, to vary width L from 0.1 $\mu$m to 2.0 $\mu$m in steps of 0.01 $\mu$m and to vary pitch S from 1.0 $\mu$m to 3.0 $\mu$m in steps of 0.01 $\mu$m. Here, the user enters "1.0" in a field of initial value and "fixed" in fields of pitch and final value, for length W of layout pattern analysis condition input section 203. Similarly, the user enters "0.1" in the field of initial value, "0.01" in the field of pitch, and "2.0" in the field of final value, for width L. The user also enters "1.0" in the field of initial value, "0.01" in the field of pitch, and "3.0" in the field of final value, for pitch S.

Thereafter, the user enters a simulation condition and an object to be analyzed in simulation analysis condition input section 204.

A defocus value X, when the user performs a simulation with a condition of identification number "B001" shown in Table 1, is assumed to be varied from −0.4 to 0.4 $\mu$m in steps of 0.1 $\mu$m. Here, the user enters "−0.4" in the field of initial value, "0.1" in the field of pitch and "0.4" in the field of final value, for defocus X in layout pattern analysis condition input unit 204. When the user sets a condition for depth of focus (hereinafter, referred to as DOF), the condition therefor is entered in DOF setting field. If the user does not set DOF, "null" is entered therein.

The present analysis target is entered in the field of "object to be analyzed". As the user analyzes width CD of the actual layout pattern in a present example, "CD" is entered in the field of "object to be analyzed".

Figure 6:
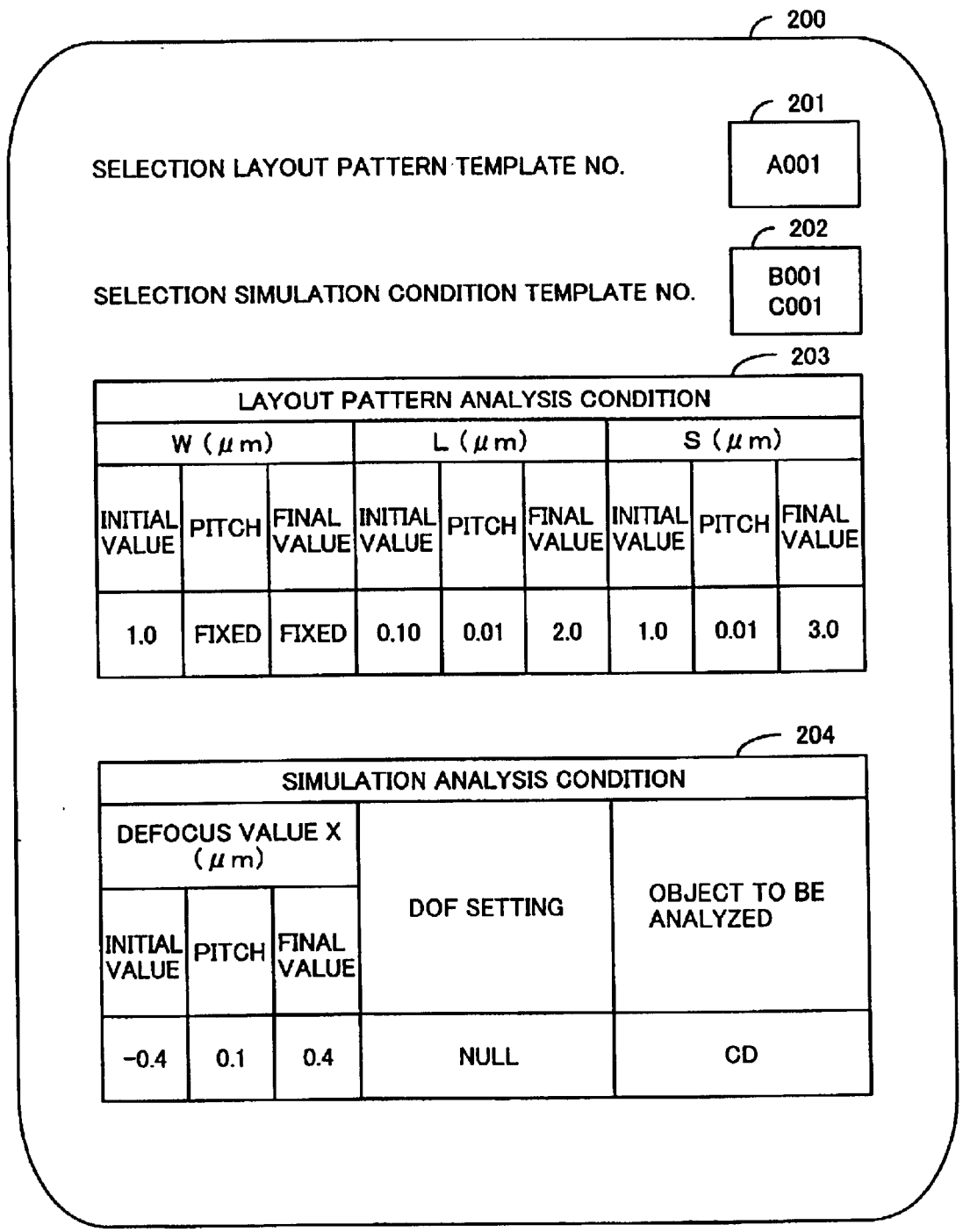
FIG. 6 is a schematic diagram of the analysis input image after entering.

FIG. 6 is a schematic diagram of an analysis input image after entering.

Thereafter, layout pattern generating unit 27, in response to the analysis condition entered in step S1, selects a prescribed layout pattern template from layout pattern template holding unit 22, and generates a plurality of design layout patterns based on the selected layout pattern template (step S2).

Specifically, layout pattern generating unit 27, in response to the identification number of the layout pattern template entered in step S1, selects a layout pattern template having the identification number "A001" from layout pattern template holding unit 22. Thereafter, in accordance with the condition entered in layout pattern analysis condition input unit 203 in FIG. 6, a plurality of design layout patterns are generated based on the layout pattern template having the identification number "A001".

Simulation condition generating unit 28 then generates a simulation condition (step S3). Simulation condition generating unit 28, in response to the identification number of the simulation condition template entered in step S1, selects a simulation optical condition having the identification number "B001" and a simulation etching condition having the identification number "C001" from simulation condition template holding unit 23. After selection, simulation condition generating unit 28 generates a plurality of simulation conditions in accordance with the condition of defocus value X entered in simulation analysis condition input section 204 in FIG. 6. Consequently, exposure wavelength, numerical aperture NA and degree of coherence a are fixed, and simulation conditions having 9 defocus values (from −0.4 to 0.4 in steps of 0.1 pitch) are generated.

Thereafter, simulation unit 17 performs a simulation using the plurality of design layout patterns generated in step S2 and the plurality of simulation conditions generated in step S3, and generates a plurality of actual layout patterns (step S4).

Figure 7A:
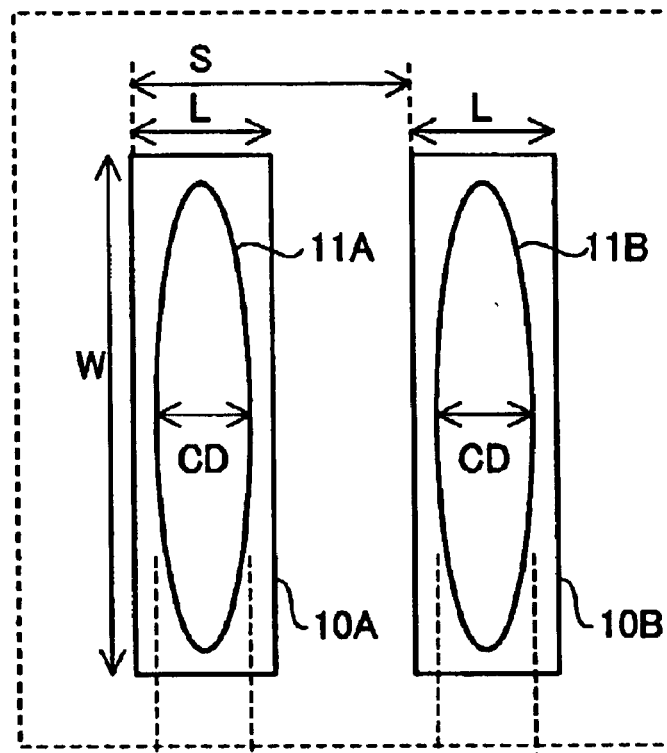
FIG. 7A is a schematic diagram representing an actual layout pattern generated in step S4 in FIG. 4.

FIG. 7A is a schematic diagram representing an actual layout pattern generated in step S4 in FIG. 4.

Figure 7B:
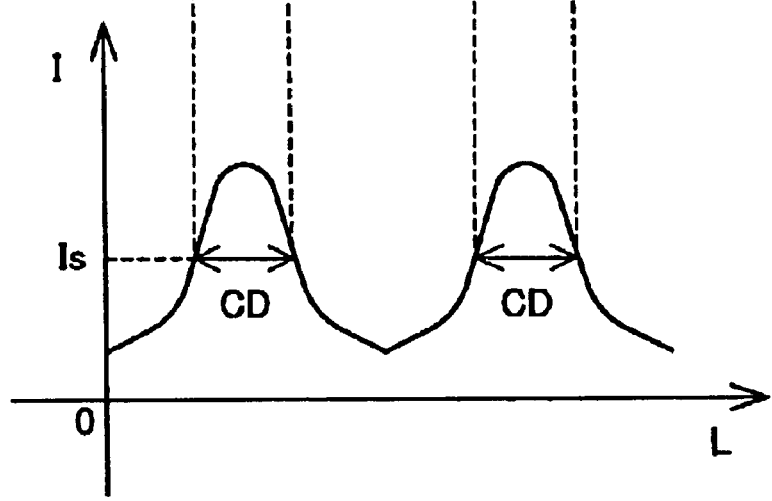
FIG. 7B shows a light intensity distribution relative to a direction of width of the pattern in FIG. 7A.

Referring to FIG. 7A, patterns 10A, 10B in FIG. 7A represent design layout patterns. Patterns 11A and 11B in FIG. 7A represent actual layout patterns. Distribution of light intensity I with respect to the direction of width L here is as shown in FIG. 7B. In simulation result holding unit 25, information of a relation of light intensity with a position shown in FIG. 7B is stored for each actual layout pattern.

Next, measuring condition determining unit 29, in response to the analysis condition entered in step S2, determines a measuring condition from measuring condition holding unit 24 (step S5).

Measuring condition determining unit 29, referring to a content in a field of "object to be analyzed" in simulation analysis condition input section 204 in FIG. 6, selects an optimal measuring condition from the plurality of measuring conditions recorded in the measuring condition table shown in Table 3. Here, measuring condition determining unit 29 may select one or a plurality of measuring conditions. When selecting one measuring condition, a more detailed condition such as a measurement site can be entered in the field of "object to be analyzed" in simulation analysis condition input section 204 in FIG. 5.

In the present example, measuring condition determining unit 29 is assumed to have selected an identification number "D001" in Table 3.

Measuring unit 30 then measures information of a plurality of actual layout patterns stored in simulation result holding unit 25, using one or more measuring conditions (step S6).

Specifically, measuring unit 30 carries out a measurement based on the measuring condition of the identification number D001 shown in Table 3. According to the measuring condition thereof, width of an actual layout pattern when light intensity I=0.3 is determined to be the width CD. Therefore, measuring unit 30 carries out a measurement, assuming that the width when I=Is=0.3 in a graph of FIG. 7B is the width CD. Measuring unit 30 measures all widths CD of the plurality of actual layout patterns.

A measurement result is stored in measurement result holding unit 26.

Through the above-described operation, a lithography process margin evaluating apparatus in Embodiment 1 of the present invention can simulate a plurality of design layout patterns and a plurality of simulation conditions, and measure a plurality of actual layout patterns after simulation. Therefore, a user does not have to enter again a new design layout pattern after simulating one design layout pattern as in a conventional example. Consequently, operational burden is reduced. In addition, since a plurality of measurement results can be easily obtained, analysis accuracy using those results will be improved.

Embodiment 2

Figure 8:
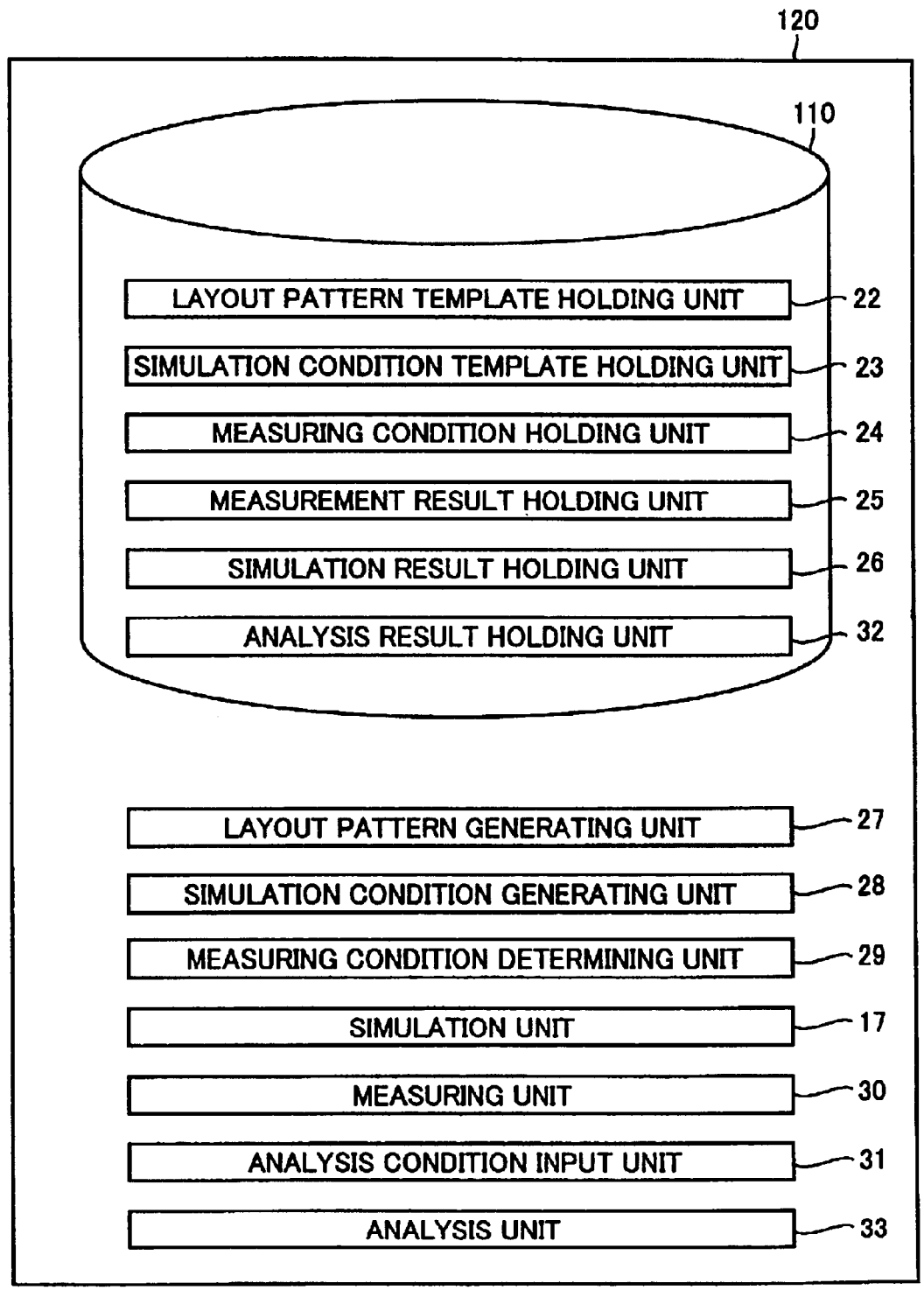
FIG. 8 is a block diagram showing a configuration of a lithography process margin evaluating apparatus in Embodiment 2 of the present invention.

FIG. 8 is a block diagram showing a configuration of a lithography process margin evaluating apparatus in Embodiment 2 of the present invention.

Referring to FIG. 8 and compared with FIG. 1, an analysis result holding unit 32 and an analysis unit 33 are added to a lithography process margin evaluating apparatus 120.

Analysis unit 33 performs an analysis according to an analysis condition, based on information stored in measurement result holding unit 26. Analysis result holding unit 32 stores a result analyzed by analysis unit 33.

As other configuration is the same as in FIG. 1, description thereof will not be repeated.

An operation of lithography process margin evaluating apparatus 120 having the afore-mentioned configuration will be described.

Figure 9:
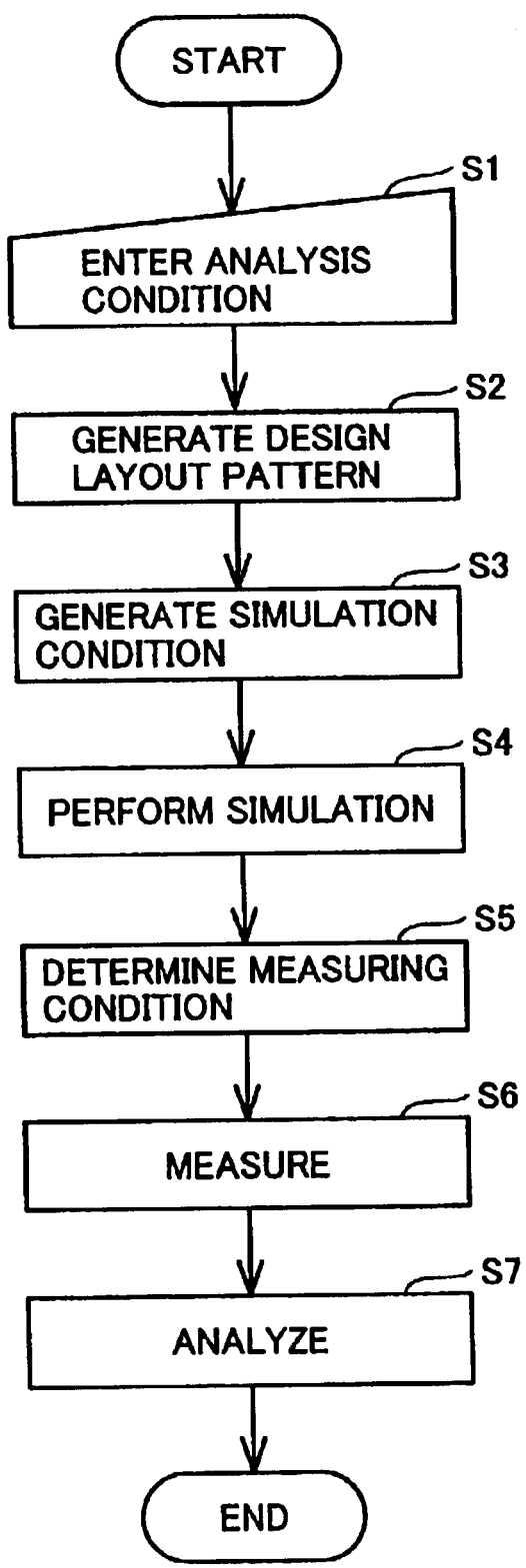
FIG. 9 is a flow chart showing an operation of the lithography process margin evaluating apparatus in Embodiment 2 of the present invention.

FIG. 9 is a flow chart showing an operation of the lithography process margin evaluating apparatus in Embodiment 2 of the present invention.

In FIG. 9, similarly as in FIG. 8, an example will be described, in which a user analyzes width CD of an actual layout pattern relative to width L of a design layout pattern, using a design layout pattern template shown in FIG. 2A.

Referring to FIG. 9, as operations of steps S1 through S6 are similar to those in FIG. 4, description thereof will not be repeated.

After measuring information of a plurality of actual layout patterns in step 86 using one or more measuring conditions, analysis unit 33 performs an analysis using a measurement result stored in measurement result holding unit 26 (step S7).

Figure 10:
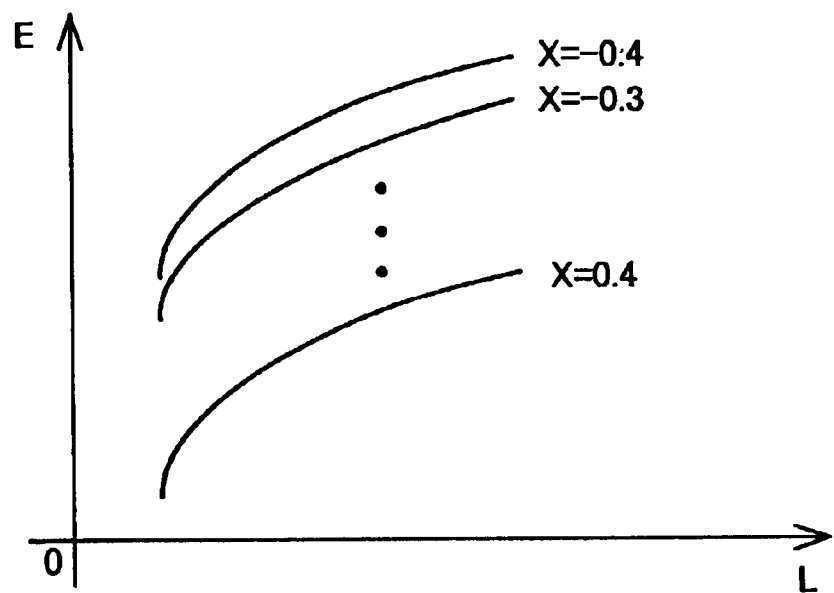
FIG. 10 shows in a graph an analysis result obtained in step S6 in FIG. 9.

FIG. 10 shows in a graph an analysis result obtained in step S6 in FIG. 9.

Referring to FIG. 10, the graph showing width CD of an actual layout pattern relative to width L of a design layout pattern is created for each simulation condition. Therefore, nine curves are shown in FIG. 10.

Figure 11:
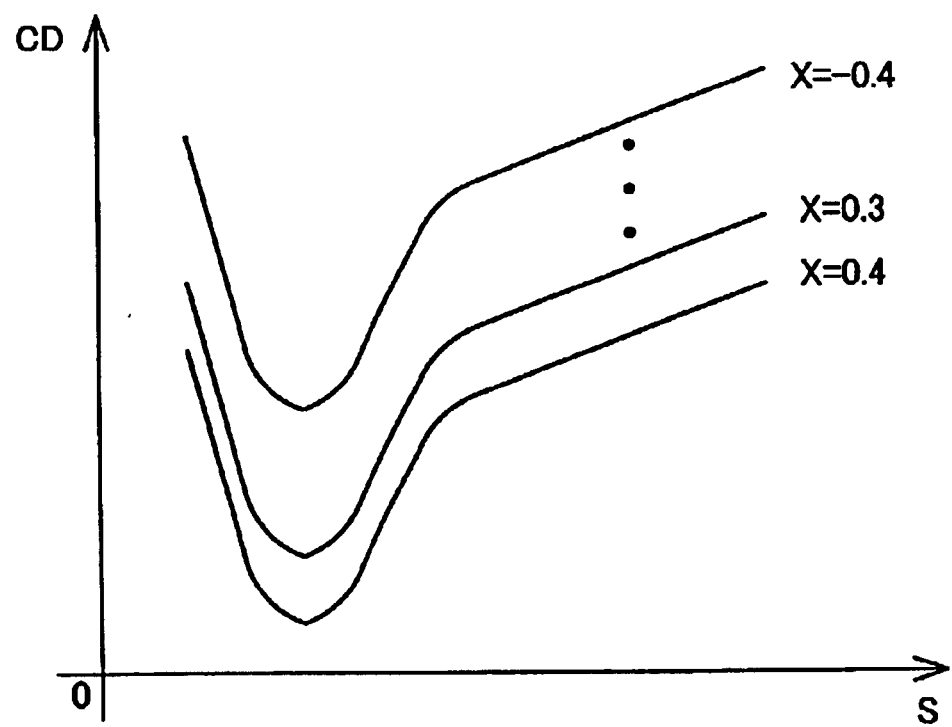
FIG. 11 shows in a graph another example with regard to the analysis result obtained in step S6 in FIG. 9.

FIG. 11 shows in a graph another example with regard to the analysis result obtained in step S6 in FIG. 9.

The graph shown in FIG. 11 illustrates a change in width CD of the actual layout pattern when pitch S of a layout pattern template in FIG. 2 as an analysis condition is varied. In order to obtain this graph, a user will have to enter a layout pattern analysis condition to vary pitch S when entering the analysis condition in step S1 in FIG. 9.

A method of analyzing depth of focus DOF will be described as another example of analysis method.

First, in order to analyze depth of focus DOF, in step S1, a condition for depth of focus DOF is entered in a field of DOF setting in simulation analysis condition input section 204 shown in FIG. 5. Assume that the defocus value X=0, and a deviation of pattern width CD of the actual layout pattern from pattern width CD of the actual layout pattern lies within 10%. In this situation, the user enters "10" in DOF setting field.

Other operations up to step S6 are similar to those in Embodiment 1.

An operation of analysis unit 33 in step S7 will now be described.

Figure 12A:
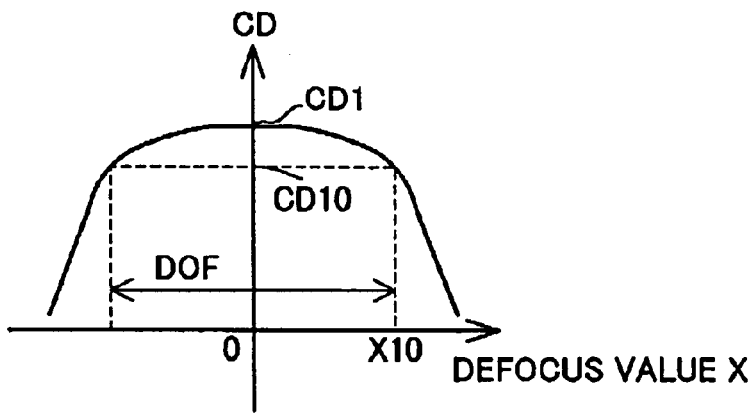
FIG. 12A shows in a graph depth of focus, among the analysis results obtained in step S6 in FIG. 9.

FIG. 12A shows in a graph depth of focus DOF, among the analysis results obtained in step S6 in FIG. 9.

FIG. 12A shows, further in detail in a graph, a relation of pattern width of the actual layout pattern with a defocus value when pattern width of the design layout pattern is 0.1 $\mu$m. Referring to FIG. 12A, when difference between pattern width CD 1 of the actual layout pattern when defocus value X=0 and pattern width CD 10 of the actual layout pattern when X=X10 is 10% of pattern width CD 1, defocus value X10 is found. When defocus value X10 is found, a value for depth of focus DOF is determined as shown in FIG. 12A.

Figure 12B:
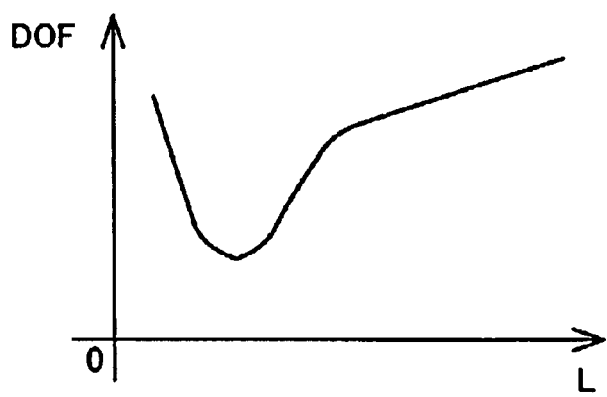
FIG. 12B shows a relation of depth of focus with pattern width of a design layout pattern.

Similarly, values for depth of focus DOF when pattern width of the design layout pattern is varied are respectively found. Consequently, a graph showing a relation of depth of focus DOF with pattern width L of the design layout pattern as shown in FIG. 12B is obtained.

Figure 12C:
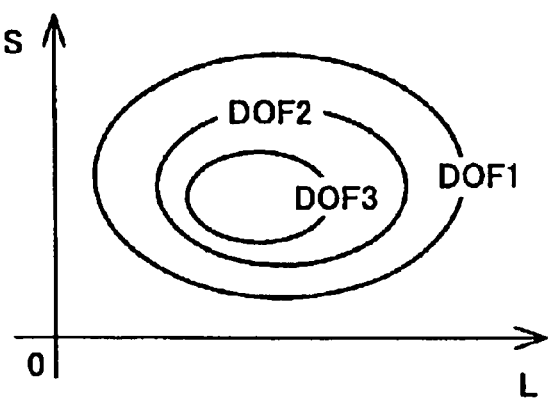
FIG. 12C shows a relation of depth of focus, pitch and pattern width of the design layout pattern.

FIG. 12C shows a relation of pattern width L, pitch S and DOF of the design layout pattern. In FIG. 12C, a DOF value is provided as a contour. A graph representing a relation between pattern width L, pitch S and DOF of the design layout pattern as shown in FIG. 12C may be provided in three-dimension.

FIG. 13 shows another example of an analysis result obtained in step S6 in FIG. 9.

FIG. 13 shows an example analyzing a change in pattern width CD of an actual layout pattern relative to an amount of edge displacement of pattern width L of the design layout pattern.

The analysis condition to be entered may be the same as in step S1 shown in FIG. 4.

Figure 13A:
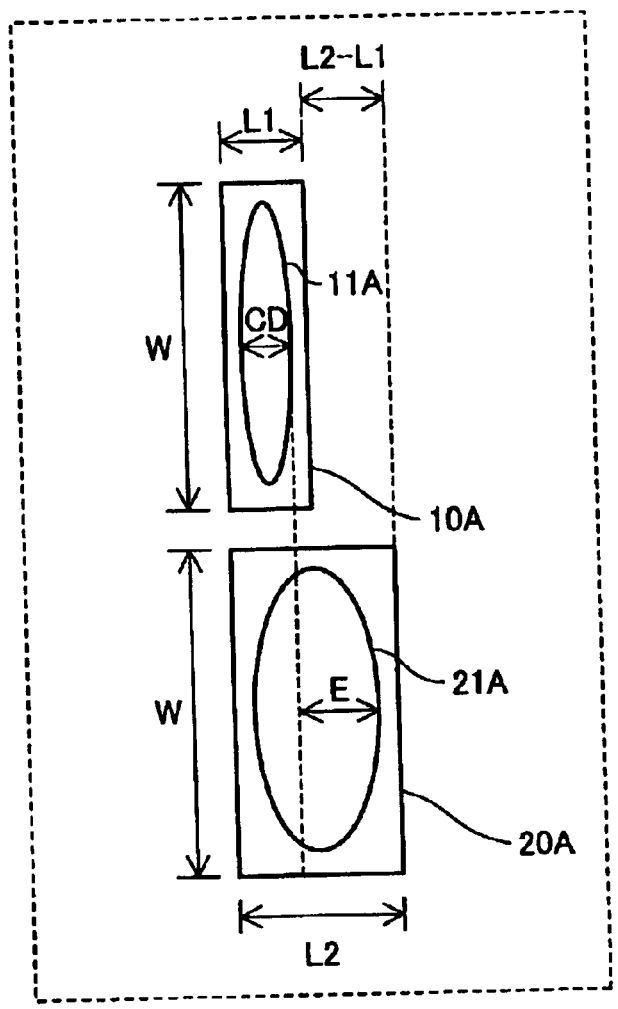
FIG. 13A is a diagram representing edge displacement of pattern width of the design layout pattern, among the analysis results obtained in step S6 in FIG. 9.
Figure 13B:
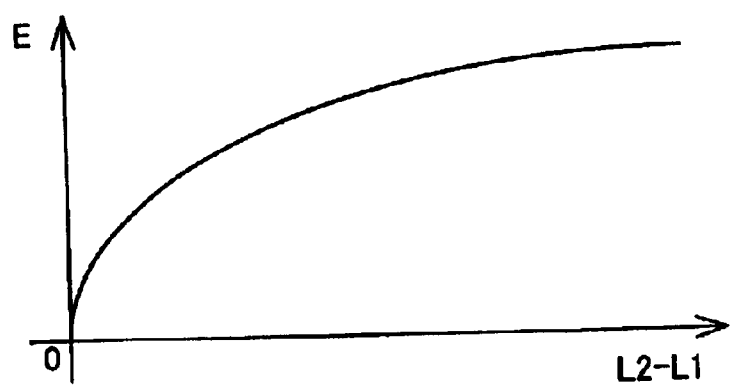
FIG. 13B shows a change in pattern width of an actual layout pattern relative to an amount of edge displacement of pattern width of the design layout pattern.

As shown in FIG. 13A, a design layout pattern 10A has pattern width L1, of which actual layout pattern is provided as 11A. On the other hand, a design layout pattern 20A has pattern width L2, of which actual layout pattern is provided as 21A. Difference between pattern widths of actual layout patterns 21A and 11A is provided as difference E of actual layout pattern width. Analysis unit 33 finds difference E of actual layout pattern width relative to difference L2–L1 in pattern width of each design layout pattern, and thus a graph shown in FIG. 13B can be found.

Figure 14:
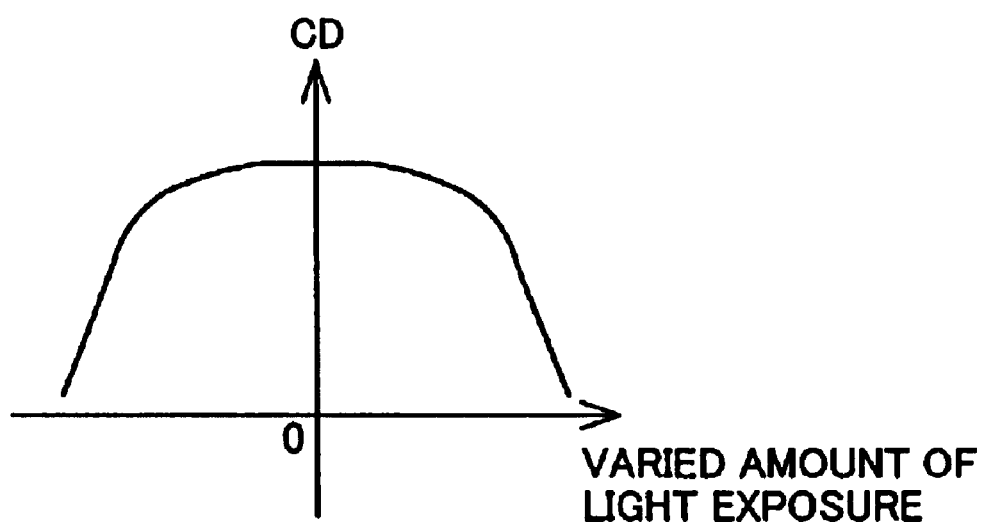
FIG. 14 shows pattern width of the actual layout pattern relative to a varied amount of light exposure.

By using analysis unit 33, pattern width CD of the actual layout pattern relative to a varied amount of exposure as shown in FIG. 14 can also be found. Here, in step S1, a user have only to enter an analysis condition so as to vary the amount of exposure, that is, light intensity.

Further, analysis unit 33 can also analyze a dimple.

FIG. 15 is a schematic diagram illustrating the dimple.

Figure 15A:
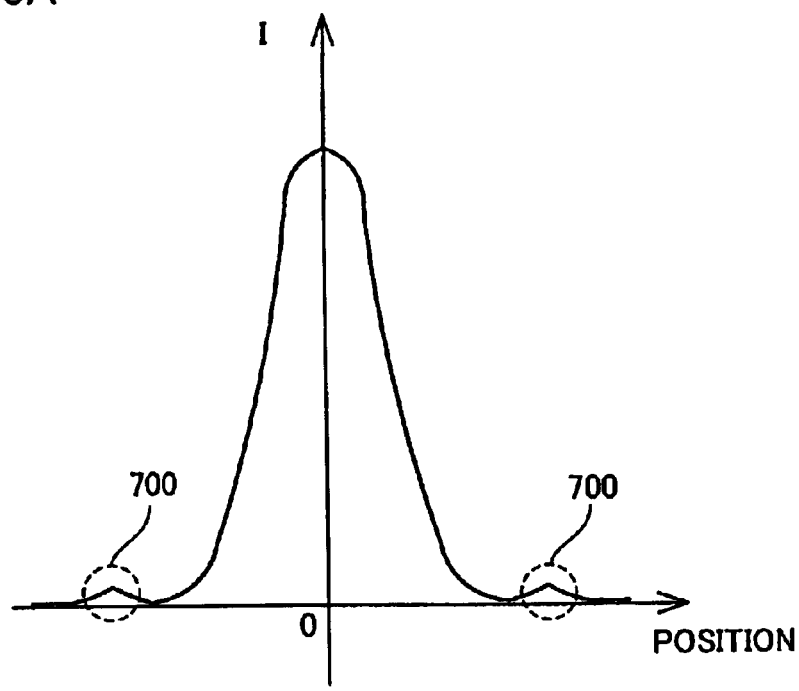
FIG. 15A shows a light intensity distribution when simulating the design layout pattern.
Figure 15B:
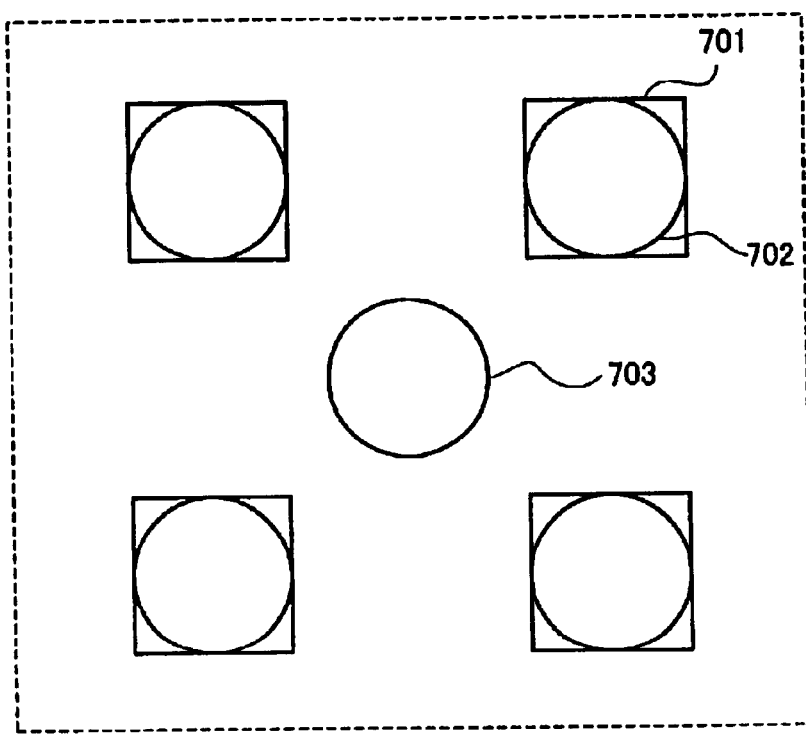
FIG. 15B shows a layout pattern when a dimple is produced.

FIG. 15A shows distribution of light intensity when simulating a design layout pattern. As shown in FIG. 15A, a side lobe 700 is produced in a position distant from a maximum value of light intensity. When a halftone-type phase shift mask is used as a mask, the entire design layout pattern transmits light, and hence, overall light intensity will be greater. Here, as the side lobes produced due to each design layout pattern overlap, not only peak intensity becomes greater but also light intensity will be larger. Consequently, in the actual layout pattern, a pattern called "dimple" is produced in a unit outside the design layout pattern. FIG. 15B shows a layout pattern when a dimple is produced. A dimple 703 is formed along with actual layout pattern 702, relative to design layout pattern 701.

Analysis unit 33 can retrieve a maximum value for light intensity and a position thereof and analyze the dimple from a measurement result.

Analysis unit 33 can perform analysis in accordance with another analysis method in addition to those described above. Analysis result is stored in analysis result holding unit 32.

Through the above-described operation, a lithography process margin evaluating apparatus in Embodiment 2 of the present invention can analyze a plurality of design layout patterns in accordance with an analysis condition. Consequently, operational burden of a user is reduced. In addition, as a plurality of analysis results can easily be obtained, the user can determine a design layout pattern of higher accuracy.

Embodiment 3

It is important to determine reference light intensity Is beforehand when analyzing a plurality of design layout patterns, because a shape of each actual layout pattern will be different if reference light intensity Is is different every time a simulation is performed, even if design layout patterns having the same shape are simulated a plurality of times.

Figure 16:
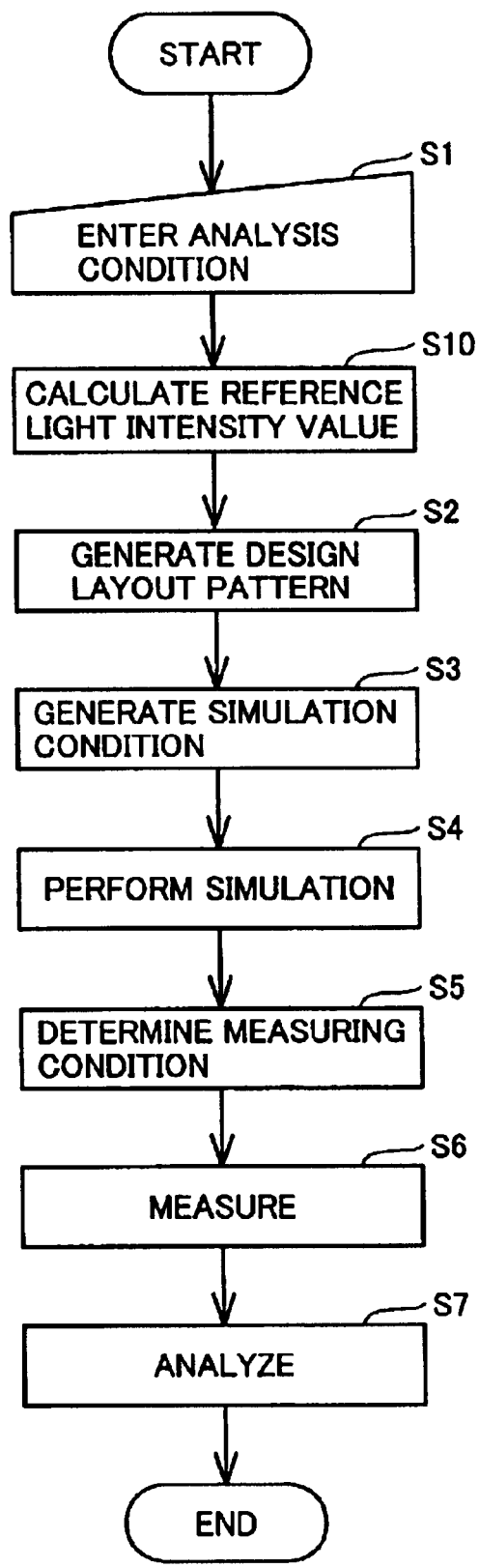
FIG. 16 is a flow chart showing an operation of a lithography process margin evaluating apparatus in Embodiment 3 of the present invention.

FIG. 16 is a flow chart showing an operation of a lithography process margin evaluating apparatus in Embodiment 3 of the present invention. Here, a configuration of the lithography process margin evaluating apparatus in Embodiment 3 is similar to that of lithography process margin evaluating apparatus 120 shown in FIG. 8.

Referring to FIG. 16 and compared to FIG. 9, in an operation in FIG. 16, an operation in a new step S10 is inserted between steps S1 and S2. In step S10, reference light intensity Is is determined. Other operations are similar to those in FIG. 9. In FIG. 16, however, an analysis condition entered by a user in step S1 is different from the one in FIG. 9.

FIG. 17 is a schematic diagram of an analysis condition input image displayed in step S1 in FIG. 16.

Referring to FIG. 17 and compared with FIG. 5, an reference CD value input section 205 is additionally provided. A user enters a reference CD value, which will be discussed below, in reference CD value input section 205.

Figure 18:
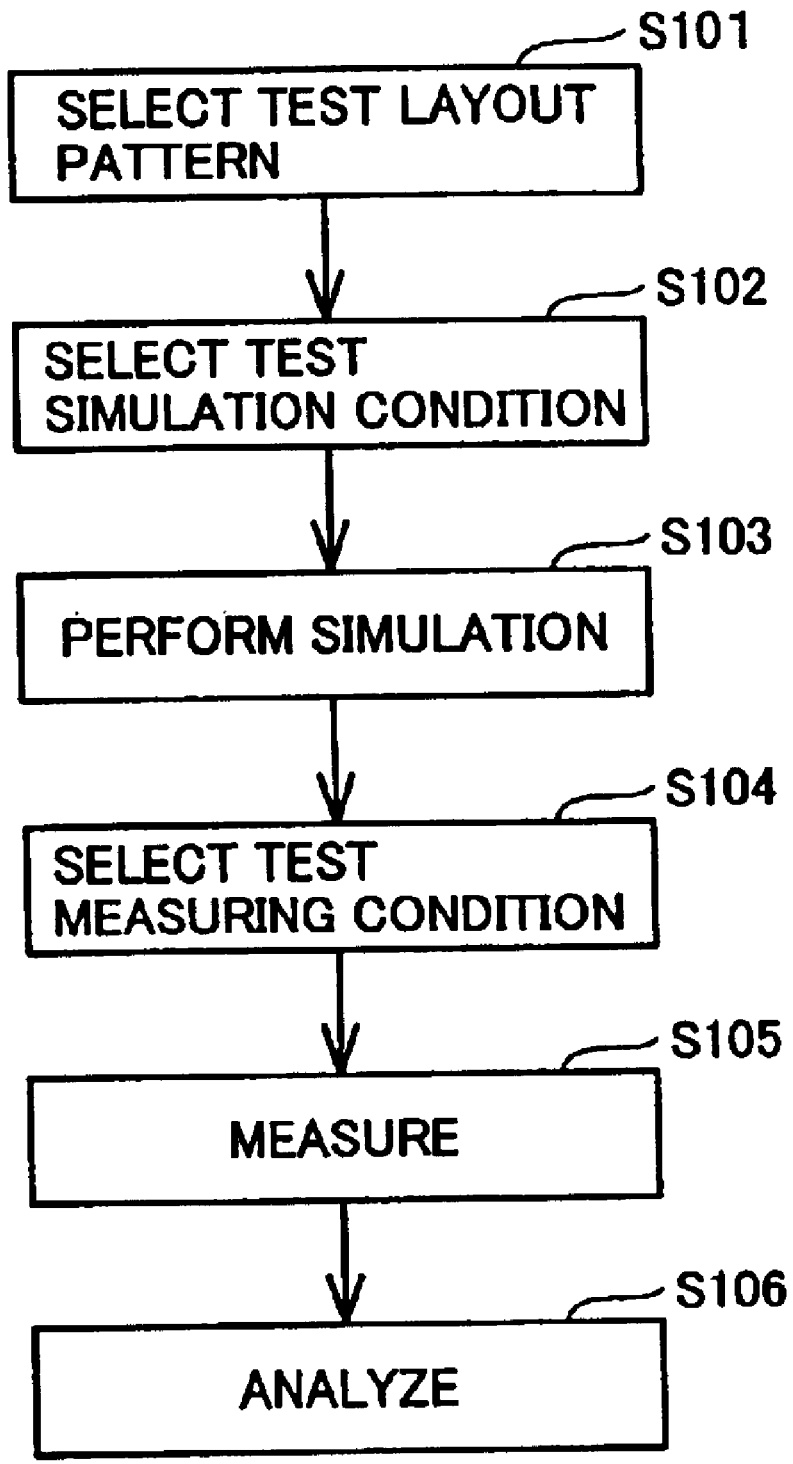
FIG. 18 is a flow chart showing a detailed operation of step S10 in FIG. 16.

FIG. 18 is a flow chart showing a detailed operation of step S10 in FIG. 16.

Referring to FIG. 18, layout pattern generating unit 27 of lithography process margin evaluating apparatus 120 selects a preset test design layout pattern from layout pattern template holding unit 22 (step S101).

An example of a condition for the test design layout pattern is shown in Table 4.

TABLE 4

| Layout Analysis | Layout Pattern Analysis Condition | | | | | | | |
|---|---|---|---|---|---|---|---|---|
| sis | W (μm) | | | L (μm) | | | S (μm) | |
| Condition | Initial Value | Pitch | Final Value | Initial Value | Pitch | Final Value | Initial Value | Pitch | Final Value |
| Test | 1.0 | Fixed | Fixed | 0.2 | Fixed | Fixed | 0.2 | Fixed | Fixed |

As shown in Table 4, when calculating reference light intensity Is, layout pattern generating unit 27 selects a fixed value for the test design layout pattern. Here, pattern width L is fixed at 0.2 μm.

In step S101, taking into account the fixed value for pattern width L of the test design layout pattern, the user enters a reference CD value in reference CD value input section 205. Here, reference CD is assumed to be 0.22 μm.

Simulation condition generating unit 28 then selects a preset test simulation condition from simulation condition template holding unit 23 (step S102). An example of the test simulation condition is shown in Table 5.

TABLE 5

| | Optical Condition | | | |
|---|---|---|---|---|
| Simulation Condition | Exposure Wavelength | NA | σ | Defocus Value |
| Test | 248 nm | 7.0 | 0.8 | 0 μm |

As shown in Table 5, the test simulation conditions are provided as fixed values.

Simulation unit 17 then performs a simulation (step S103). Obtained information of an actual layout pattern is stored in simulation result holding unit 25.

Measuring condition determining unit 29 then selects a test measuring condition from measuring condition holding unit 24. The test measuring condition is defined so as to measure an intensity distribution in a direction of pattern width CD of the actual layout pattern.

A result measured as described above is stored in measurement result holding unit 25.

Thereafter, analysis unit 33 will make an analysis based on the measurement result (step S106).

Figure 19:
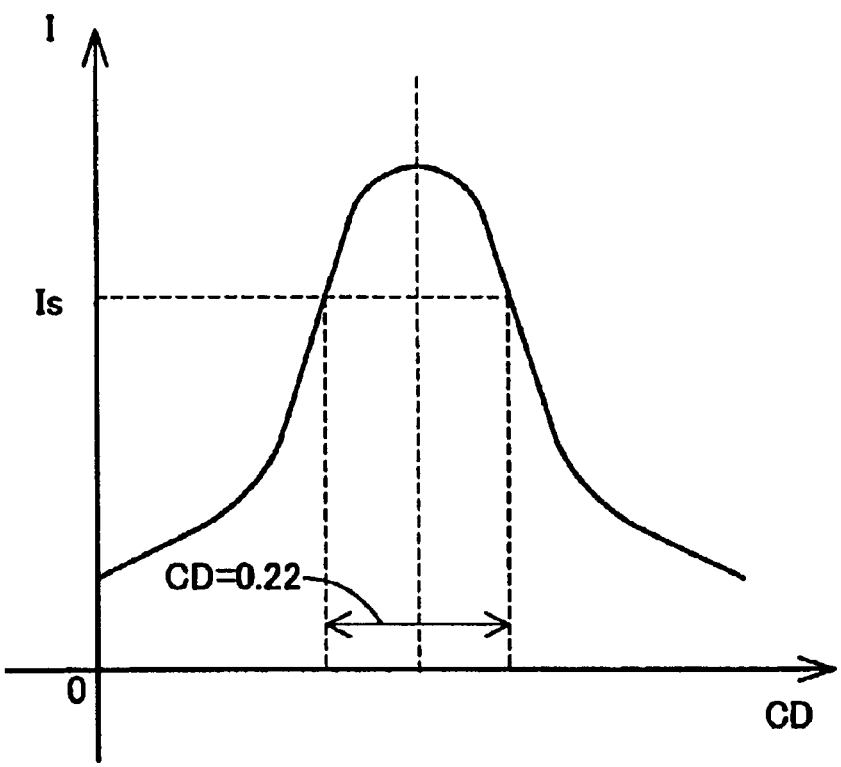
FIG. 19 is a diagram representing an analysis method in step S106 in FIG. 18.

FIG. 19 is a diagram representing an analysis method in step S106 in FIG. 18.

Referring to FIG. 19, analysis unit 33 first provides, as a graph, a light intensity distribution in a direction of pattern width CD of the actual layout pattern. After plotting the graph, analysis unit 33 determines a light intensity value Is for which a value for pattern width CD attains 0.22 μm. The determined light intensity value Is is provided as a reference light intensity value.

Through the above-described operation, a light intensity value can be initially determined easily when continuously simulating a plurality of design layout patterns. Thus, operational burden of a user is reduced.

Embodiment 4

Figure 20A:
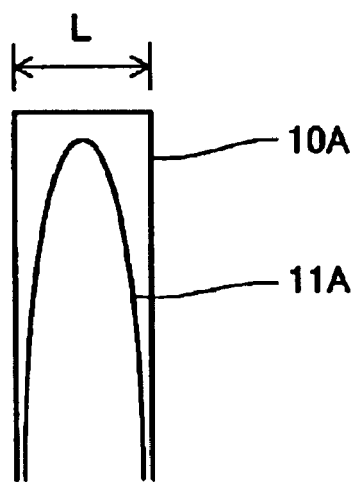
FIG. 20A shows an actual layout pattern relative to a design layout pattern.

FIG. 20A shows an actual layout pattern relative to a design layout pattern. Actual layout pattern 11A is generated with respect to design layout pattern 10A There is a difference, however, between shapes of the actual layout pattern and the design layout pattern, particularly in a tip end portion. Since design layout pattern 10A represents an ideal layout pattern, the shape of actual layout pattern 11A is desirably a dose approximation to that of design layout pattern 10A. A technique devised therefor is OPC.

Figure 20B:
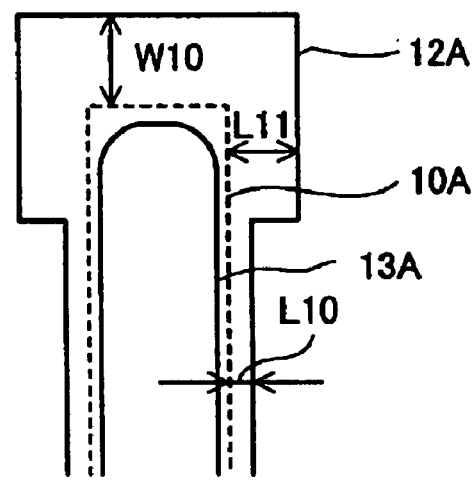
FIG. 20B is a schematic diagram representing OPC.

FIG. 20B is a schematic diagram representing OPC. OPC refers to a technique in which, predicting light intensity and the like in exposure, a corrected layout pattern is generated, which pattern is modified in shape in advance of the design layout pattern so that actual layout pattern 11A will have the same shape as design layout pattern 10A An actual layout pattern 13A can be obtained by performing a simulation using corrected layout pattern 12A modified in shape of design layout pattern 10A Actual layout pattern 13A, compared with actual layout pattern 11A, has a shape closer to design layout pattern 10A.

It is desirable for a lithography process margin evaluating apparatus to be able to generate a corrected layout pattern that has been subjected to above-described OPC.

Figure 21:
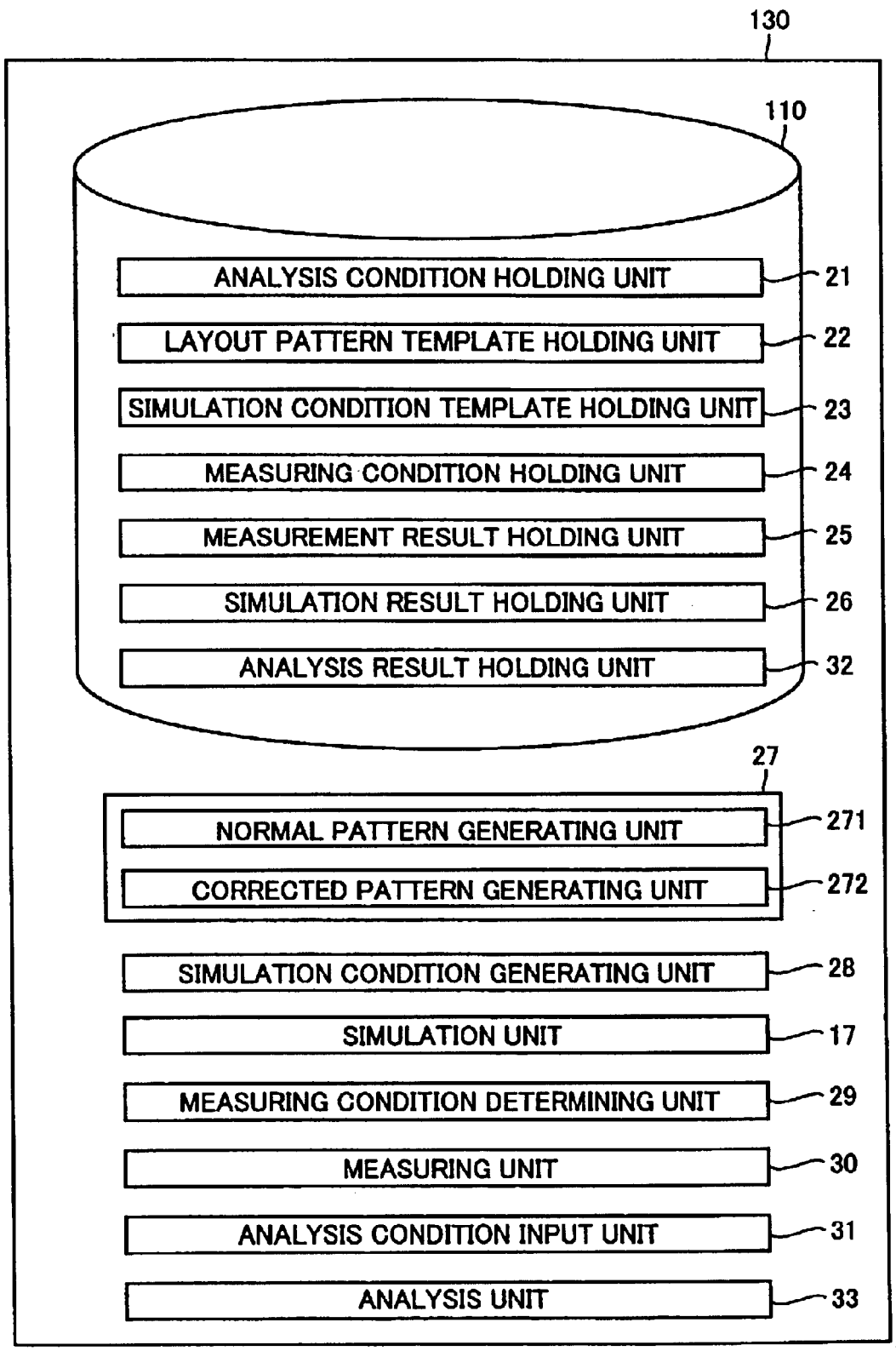
FIG. 21 is a block diagram showing a configuration of a lithography process margin evaluating apparatus in Embodiment 4 of the present invention.

FIG. 21 is a block diagram showing a configuration of a lithography process margin evaluating apparatus in Embodiment 4 of the present invention.

Referring to FIG. 21, a lithography process margin evaluating apparatus 130, compared with lithography process margin evaluating apparatus 120 shown in FIG. 8, includes a normal pattern generating unit 271 and a corrected pattern generating unit 272 in layout pattern generating unit 27. Normal pattern generating unit 271 generates a plurality of design layout patterns. Corrected pattern generating unit 272 generates a corrected layout pattern subjected to OPC, for each of the plurality of design layout patterns.

As other configurations are similar to those in FIG. 8, description thereof will not be repeated.

An operation of lithography process margin evaluating apparatus 130 having the above-described configuration will now be described.

Figure 22:
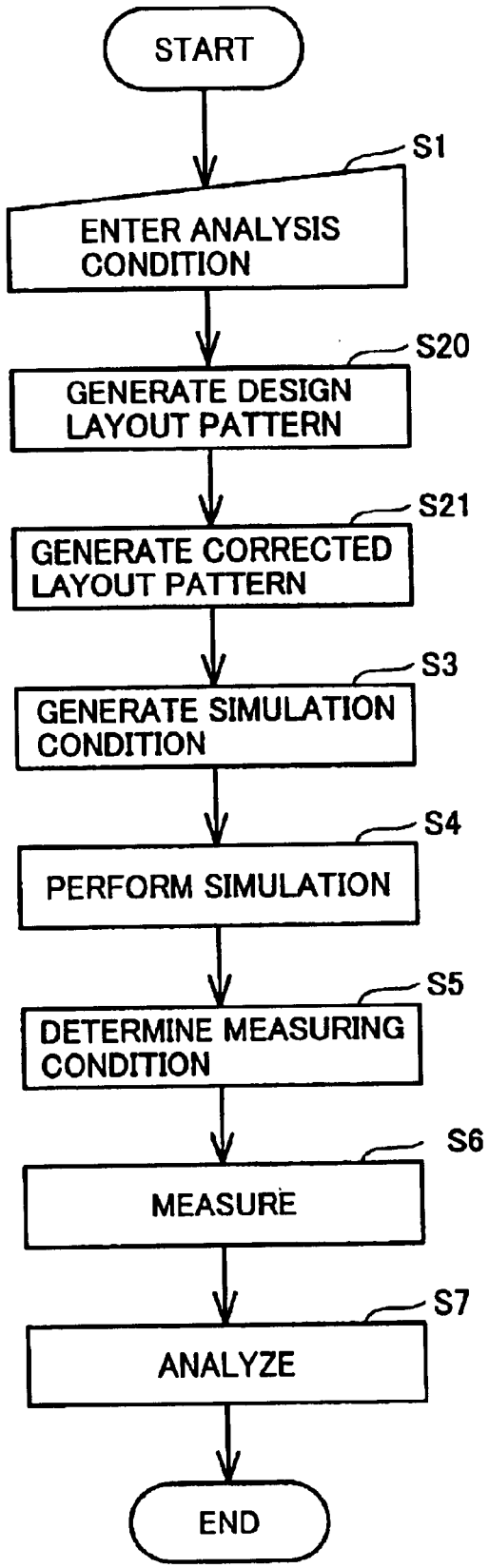
FIG. 22 is a flow chart showing an operation of the lithography process margin evaluating apparatus in Embodiment 4 of the present invention.

FIG. 22 is a flow chart showing an operation of the lithography process margin evaluating apparatus in Embodiment 4 of the present invention.

Referring to FIG. 22 and compared with FIG. 9, an operation in step S2 is divided into step S20 and step S21. In step S20, similarly as in step S2, a plurality of design layout patterns are generated. In step S21, corresponding to the plurality of design layout patterns generated in step S20, a plurality of corrected layout patterns are formed. The plurality of corrected layout patterns are generated by corrected pattern generating unit 272. Other steps are similar to those in FIG. 9. However, simulation, measurement and analysis are performed with respect to a design layout pattern and a corresponding corrected layout pattern in a similar manner.

Through the above-described operation, operational burden in simulation and analysis accompanying OPC can be reduced.

Embodiment 5

With regard to a lithography process margin evaluating apparatus in Embodiment 4, an example has been described, in which an analysis operation accompanying OPC is possible. It is more desirable, however, to be able to select an optimal corrected layout pattern when a plurality of corrected layout patterns are generated for one design layout pattern.

The lithography process margin evaluating apparatus in Embodiment 5 of the present invention is of the same configuration as lithography process margin evaluating apparatus 130 in Embodiment 4. Analysis unit 33, however, has a function to determine an optimal corrected layout pattern among a plurality of corrected layout patterns generated for one design layout pattern.

Figure 23:
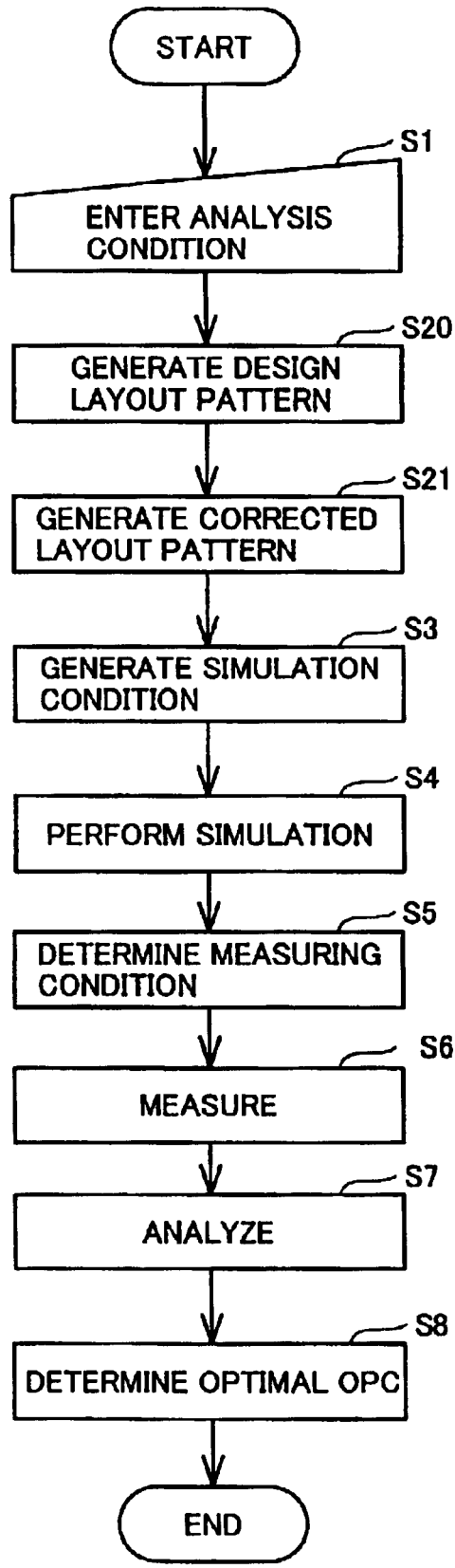
FIG. 23 is a flow chart showing an operation of a lithography process margin evaluating apparatus in Embodiment 5.

FIG. 23 is a flow chart showing an operation of the lithography process margin evaluating apparatus in Embodiment 5.

Referring to FIG. 23 and compared to FIG. 22, step S8 is added to determine an optimal corrected layout pattern after analysis in step S7. Other operations are similar to those in FIG. 22. When entering an analysis condition in step S1, however, an OPC condition will be entered.

Figure 24:
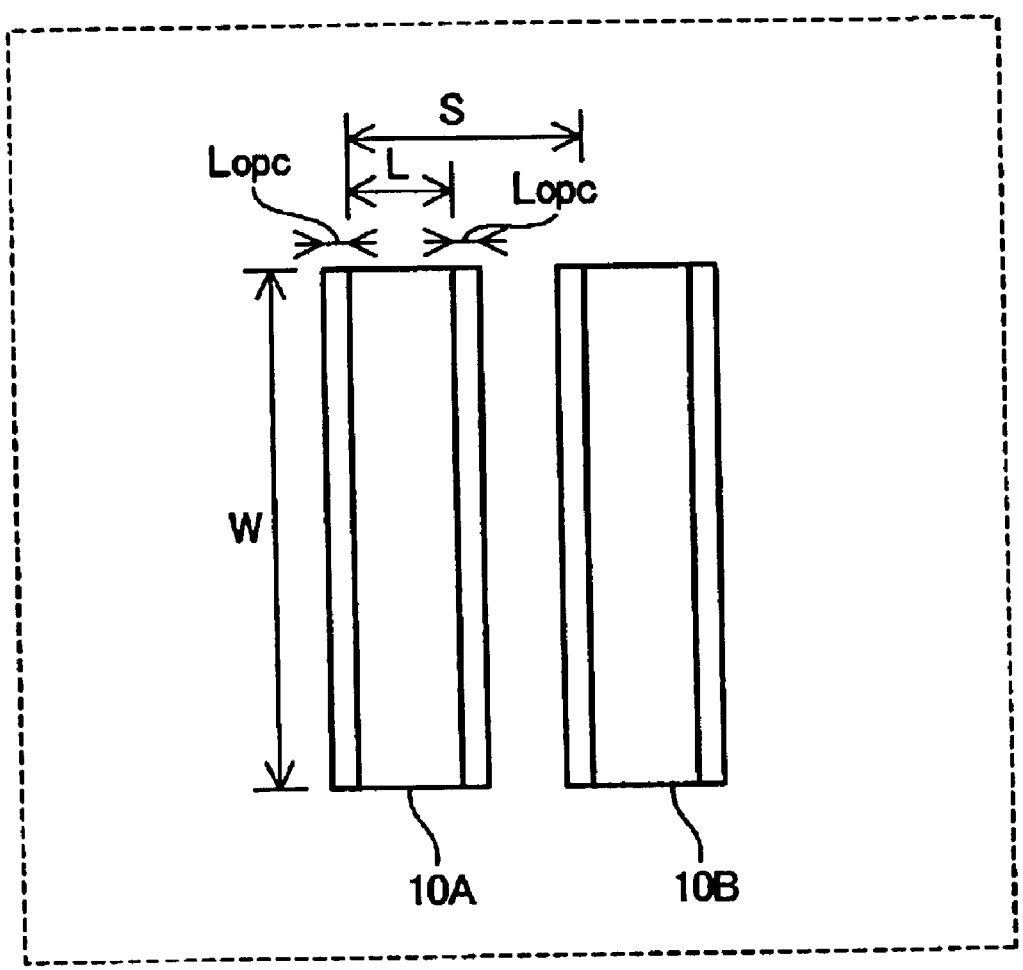
FIG. 24 is a diagram representing a design layout pattern and a corrected layout pattern in Embodiment 5 of the present invention.

FIG. 24 is a diagram representing a design layout pattern and a corrected layout pattern in Embodiment 5 of the present invention.

Referring to FIG. 24, design layout patterns 10A, 10B are the same as in FIG. 2. Pattern width of a corrected layout pattern provided as a result of OPC for design layout pattern 10A is assumed to be L+2 Lopc. Here, line-and-space of the design layout pattern and the corrected layout pattern has the same pitch S.

FIG. 25 is a schematic diagram of an analysis condition input image displayed in step S1 in FIG. 23.

Compared with the analysis input image shown in FIG. 5, an input section 206 is added for entering varied value Lopc for pattern width after OPC. For example, when a user varies Lopc as an OPC condition from −0.04 to 0.04 μm in 0.005 μm pitch respectively, the user will enter "−0.04" in "initial value" field, "0.005" in "pitch" field and "0.04" in "final value" field, of Lopc input section 206 respectively. Consequently, in step S20 in FIG. 23, corrected layout patterns are generated in numbers in accordance with conditions entered in Lopc input section 206 with respect to one design layout pattern.

An operation of analysis unit 33 in step S8 will now be described.

In step S20, a plurality of corrected layout patterns 1AA–nAA (n is a natural number) are generated for design layout pattern 10A. Corrected layout patterns 1AA–nAA generated are simulated respectively in step S4. A plurality of actual layout patterns generated here are referred to as corrected actual layout patterns. In step S6, pattern width CDopc and light intensity Iopc of a plurality of corrected actual layout patterns are measured.

Analysis unit 33 determines an optimal Lopc, using an evaluation function F(a,b).

An example of evaluation function F(a,b) is shown below.

$F(a,b)=|a-L|(b<0.1)$ $F(a,b)=999(b \geq 0.1)$

Analysis unit 33 calculates evaluation function F(CDopc, Iopc) for the plurality of corrected layout patterns relative to each design layout pattern, as a=CDopc, b=Iopc.

As a result of calculation, an Lopc where evaluation function F (CDopc, Iopc) attains a minimum value is determined as an optimal OPC condition for the design layout pattern.

Evaluation function F (QDopc, Iopc) will attain a minimum value at an Lopc where Iopc<0.1 is satisfied and pattern width CDopc is closest to pattern width L of the design layout pattern.

After calculating the optimal OPC condition for each design layout pattern, analysis unit 33 creates a table having pattern width L and pitch S of the design layout pattern as row and column respectively, and records a corresponding Lopc therein.

Through the above-described operation, a lithography process margin evaluating apparatus can determine an optimal OPC condition for a design layout pattern. Thus, operational burden is reduced.

Embodiment 6

Figure 26:
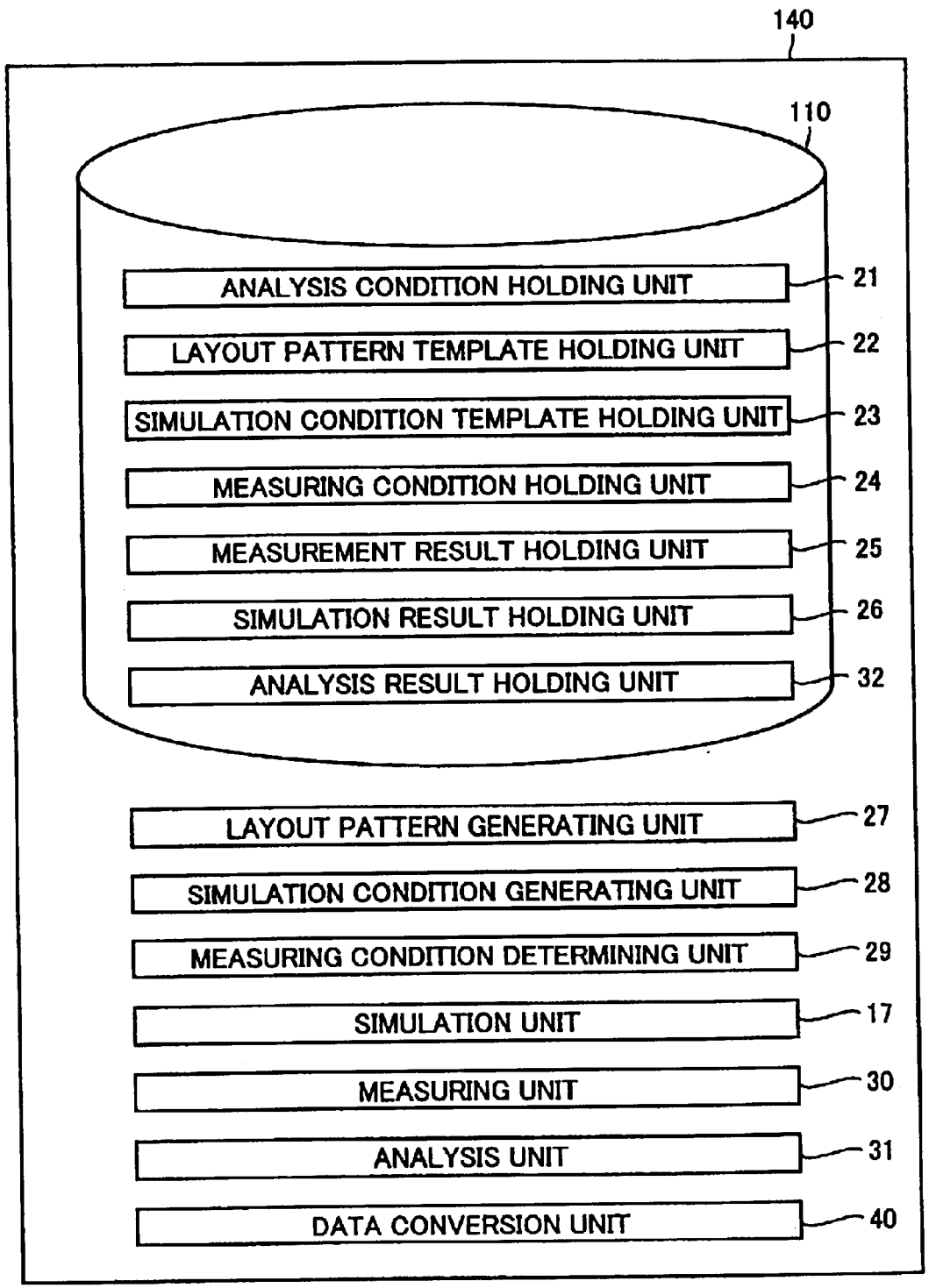
FIG. 26 is a block diagram showing a configuration of a lithography process margin evaluating apparatus in Embodiment 6 of the present invention.
Figure 27:
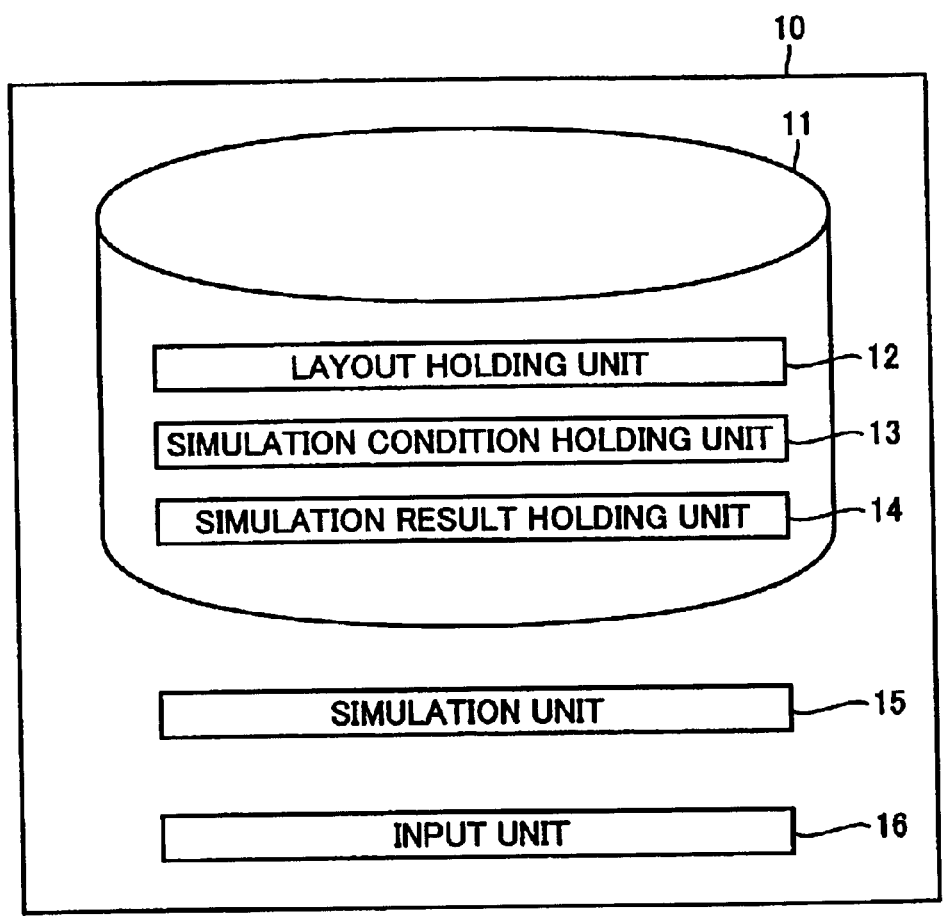
FIG. 27 is a block diagram showing a configuration of a conventional lithography simulation apparatus.
Figure 28:
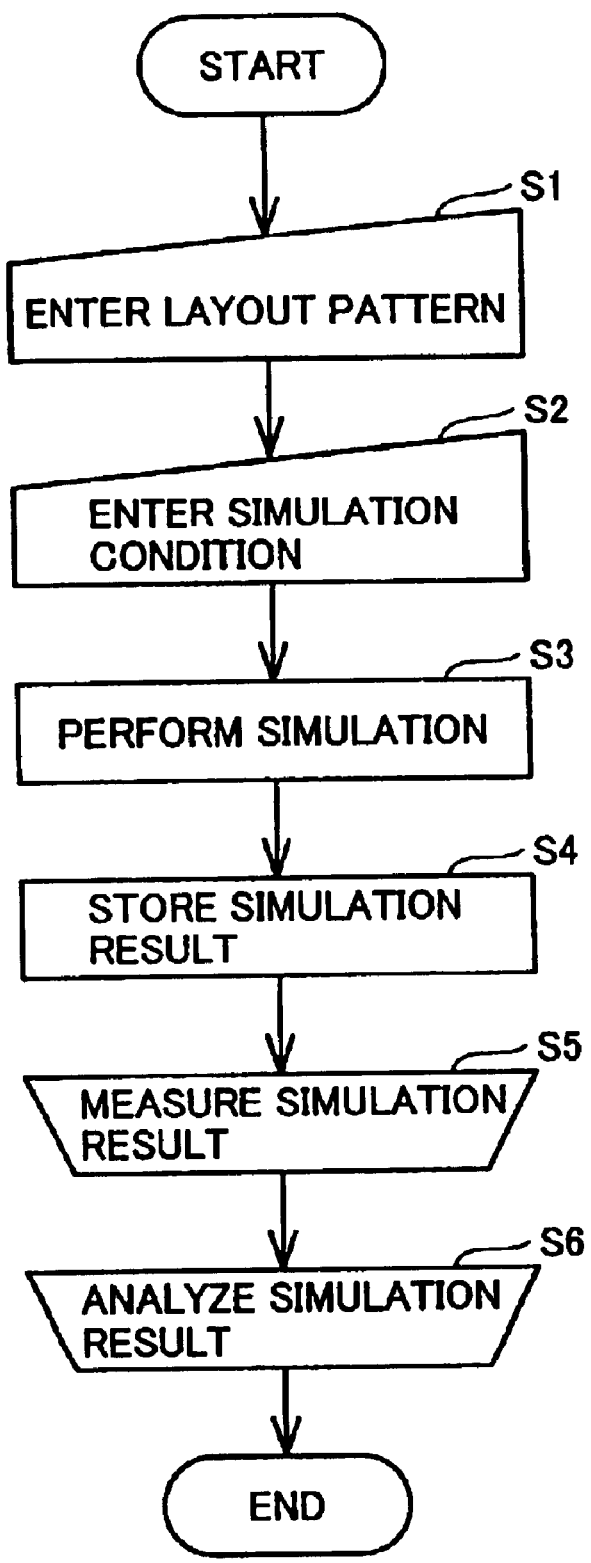
FIG. 28 is a flow chart showing an operation of the conventional lithography simulation apparatus.

FIG. 26 is a block diagram showing a configuration of a lithography process margin evaluating apparatus in Embodiment 6 of the present invention.

Referring to FIG. 26, a data conversion unit 40 is added to a lithography process margin evaluating apparatus 140, compared with lithography process margin evaluating apparatus 120. Other configurations are the same as in FIG. 8.

Data conversion unit 40 converts data of a plurality of design layout patterns, which are generated by layout pattern generating unit 27 in lithography process margin evaluating apparatus 140 to manufacturing data. Manufacturing data refers to data usable in a manufacturing apparatus such as a mask writing apparatus, a direct writing apparatus and a defect inspection apparatus.

Manufacturing data includes arrangement information, for example, of how to arrange a plurality of design layout patterns on a semiconductor substrate. Attribute information for respective design layout pattern is also included. Attribute information refers to, for example, a layer number corresponding to a semiconductor process step or an amount of exposure used in manufacturing.

Since the data of the design layout pattern can be converted to this manufacturing data, operational burden can be reduced when actually generating a design layout pattern as a trial.

The above-described lithography process margin evaluating apparatus is implemented by a program for attaining the function of the lithography process margin evaluating processing.

The present invention may include the program itself or a computer-readable storage medium storing the same.

In the present invention, the storage medium may be a memory (not shown), such as an ROM itself, necessary for processing in a lithography process margin evaluating apparatus in FIG. 1. Alternatively, it may be implemented as a readable storage device, by providing a program-reading device (not shown) outside the lithography process margin evaluating apparatus and inserting therein a storage medium. In either case, the program being stored may be accessed and executed by the lithography process margin evaluating apparatus; or in either case, the program may be read and the read program may be loaded to a program storage area (not shown) of the lithography process margin evaluating apparatus and then executed. The program for loading is assumed to be stored in advance in the lithography process margin evaluating apparatus.

Here, the above storage medium is adapted to be separable from the lithography process margin evaluating apparatus. The storage medium may be a storage medium including tape-type such as a magnetic tape and a cassette tape; disk-type such as a magnetic disk including a floppy disk, a hard disk and the like as well as an optical disk including a CD-ROM, an MO, an MD, a DVD and the like; card-type such as an IC card, a memory card, an optical card and the like; or a semiconductor memory such as a mask ROM, an EPROM, an EEPROM, a flash ROM and the like.

In addition, the present invention includes a system having a configuration connectable to a network such as the Internet, and thus, may include a storage medium downloading and storing a program from the network. When downloading the program from the network in such a manner, the program for downloading may be pre-installed in the lithography process margin evaluating apparatus, or may be installed from another storage medium.

Contents stored in the storage medium may include data, not limited to a program.

The present invention may be processing itself as a program executed in the lithography process margin evaluating apparatus shown in FIG. 1. The program may be taken in, or may have been taken in, or may be sent out, by accessing a network including the Internet.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A lithography process margin evaluating apparatus simulating a light intensity distribution within a photosensitive material on a semiconductor substrate and an actual layout pattern formed on said semiconductor substrate, using a design layout pattern formed on a mask, comprising:

an analysis condition receiving unit receiving an analysis condition for analyzing said actual layout pattern;

a layout pattern template holding unit storing a plurality of design layout pattern templates;

a simulation condition template holding unit storing a plurality of simulation condition templates;

a measuring condition holding unit storing a plurality of measuring conditions for measuring said actual layout pattern;

a layout pattern generating unit selecting among said plurality of design layout pattern templates and generating a plurality of design layout patterns based on said analysis condition and said selected design layout pattern template;

a simulation condition generating unit selecting a simulation condition template and generating a plurality of simulation conditions based on said received analysis condition and said selected simulation condition template;

a simulation unit simulating the actual layout pattern transferred to the photosensitive material on said semiconductor substrate, using said plurality of design layout patterns and said plurality of simulation conditions;

a measuring condition determining unit determining a measuring condition among said plurality of measuring conditions, based on said analysis condition; and a measuring unit measuring said actual layout pattern with said determined measuring condition.

2. The lithography process margin evaluating apparatus according to claim 1, further comprising an analysis unit analyzing said actual layout pattern, using said received analysis condition and a measurement result from said measuring unit.

3. The lithography process margin evaluating apparatus according to claim 2, wherein said simulation unit simulates a test layout pattern, using a prescribed design layout pattern and a prescribed simulation condition prior to simulation based on said received analysis condition, said measuring unit measures said test layout pattern with a prescribed measuring condition, and said analysis unit determines a reference light intensity value, using the measurement result from said measuring unit.

4. The lithography process margin evaluating apparatus according to claim 2, wherein said layout pattern generating unit includes a normal pattern generating unit generating said plurality of design layout patterns based on said analysis condition and said selected design layout pattern template, and a corrected pattern generating unit generating a plurality of corrected layout patterns by performing optical proximity correction of said plurality of design layout patterns.

5. The lithography process margin evaluating apparatus according to claim 4, wherein said corrected pattern generating unit generates said plurality of corrected layout patterns for each of said plurality of design layout patterns, and said analysis unit selects one from said plurality of corrected layout patterns for said each design layout pattern based on said analysis condition.

6. The lithography process margin evaluating apparatus according to claim 2, further comprising a data conversion unit converting data of said plurality of design layout patterns generated by said layout pattern generating unit to data usable in a manufacturing apparatus.

* * * * *